(12) United States Patent
Taguchi

(10) Patent No.: US 7,755,922 B2
(45) Date of Patent: Jul. 13, 2010

(54) NON-VOLATILE RESISTANCE CHANGING FOR ADVANCED MEMORY APPLICATIONS

(75) Inventor: Masao Taguchi, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 15 days.

(21) Appl. No.: 11/724,788

(22) Filed: Mar. 16, 2007

(65) Prior Publication Data

US 2008/0175035 A1 Jul. 24, 2008

Related U.S. Application Data

(60) Provisional application No. 60/877,887, filed on Dec. 29, 2006.

(51) Int. Cl.
*G11C 11/00* (2006.01)

(52) U.S. Cl. .............. 365/148; 365/158; 365/163; 365/189.07; 365/189.09

(58) Field of Classification Search ............ 365/148, 365/175, 158, 163, 205, 189.07, 189.09
See application file for complete search history.

(56) References Cited

U.S. PATENT DOCUMENTS

| | | | |
|---|---|---|---|
| 6,927,996 B2 * | 8/2005 | Eaton et al. | 365/171 |
| 6,930,911 B2 * | 8/2005 | Ezaki et al. | 365/158 |
| 7,283,413 B2 * | 10/2007 | Choi et al. | 365/205 |
| 2006/0203541 A1 * | 9/2006 | Toda | 365/163 |
| 2008/0094874 A1 * | 4/2008 | Liaw | 365/148 |
| 2008/0117667 A1 * | 5/2008 | Nirschl et al. | 365/163 |

* cited by examiner

*Primary Examiner*—Hoai V Ho
*Assistant Examiner*—Kretelia Graham
(74) *Attorney, Agent, or Firm*—Eschweiler & Associates, LLC

(57) ABSTRACT

A resistance changing memory unit cell includes a resistance changing memory element coupled to a sense bit line and a diode coupled to the resistance changing memory element.

19 Claims, 18 Drawing Sheets

NON-VOLATILE RESISTANCE CHANGING FOR ADVANCED MEMORY APPLICATIONS

REFERENCE TO RELATED APPLICATIONS

This application claims the benefit of U.S. Provisional Patent Application Ser. No. 60/877,887 which was filed Dec. 29, 2006, entitled "NON-VOLATILE RESISTIVE SWITCHING FOR ADVANCED MEMORY APPLICATIONS."

FIELD OF INVENTION

The invention is generally related to the field of memory devices and more particularly to devices, architectures and methods associated with resistance changing non-volatile memory.

BACKGROUND OF THE INVENTION

Flash and other types of electronic memory devices are constructed of memory cells that individually store and provide access to data. A first generation type memory cell stores a single binary piece of information referred to as a bit, which has one of two possible states. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells, where the data can then be retrieved in a read operation. In addition to programming (sometimes referred to as write) and read operations, groups of cells in a memory device may be erased, wherein each cell in the group is set to a known initial state (e.g., a one "1").

The individual memory cells typically comprise a semiconductor structure adapted for storing a bit of data. For instance, many conventional memory cells include a metal oxide semiconductor (MOS) device in which a binary piece of information may be retained. The erase, program, and read operations are commonly performed by application of appropriate voltages to specific terminals of the cell MOS device. In an erase or program operation the voltages are applied so as to cause a charge to be stored in or removed from the memory cell. In a read operation, appropriate voltages are applied to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

Flash memory is a non-volatile type of memory which can be modified and hold its content without power. Conventional single-bit flash memories are constructed in a cell structure wherein a single bit of information is stored in each flash memory cell. Each such flash memory cell includes a transistor structure having a source, a drain, and a channel in a substrate or doped well, as well as a gate storage structure overlying the channel. The gate storage structure may include dielectric layers formed on the surface of the doped well. The dielectric layer is often a multilayer insulator such as an oxide-nitride-oxide (ONO) layer having two oxide layers sandwiching a nitride layer.

A new generation of non-volatile memory that has emerged is called resistance changing memory, wherein a variable resistance is employed to identify a state of a memory cell. Such resistance changing memory devices have some advantages in reducing cell size and therefore improving memory cell density, thereby reducing memory cost.

One exemplary prior art resistance changing memory unit cell is illustrated in prior art FIG. 1, at reference numeral 10. In FIG. 1, the unit cell 10 comprises a resistance changing memory element 12 coupled between a bit line 14 and a select transistor 16. The select transistor 16 has a gate terminal 18 coupled to a word line 20, and is coupled between the memory element 12 and a common source potential 22 such as ground. The unit cell 10 of prior art FIG. 1 is configured in what some call a NOR type array architecture. In the NOR architecture, multiple unit cells 10 are coupled as illustrated along a single bit line 14, and coupled to ground. In addition, multiple bit lines or columns are provided, and word lines 20 or rows extend substantially perpendicular thereto. Extending word lines 20 couple to respective unit cells of differing bit lines. In the above manner, multiple cells may be addressed concurrently, wherein by addressing a single word line, those unit cells of different bit lines coupled to the addressed word line are addressed. This concurrent addressing is sometimes referred to as a page mode.

An exemplary cross section of a resistance changing unit cell 10 is illustrated in prior art FIG. 2. The unit cell comprises the select transistor 16 having a gate electrode 18 coupled to the word line 20 (not shown). The transistor 16 has source and drain regions, wherein the source region 24 is coupled to a common source potential 22, and the drain 26 is coupled to the resistance changing element 12 via conductive contacts 28. The resistance changing element 12 is then coupled to an overlying bit line 14 via another conductive contact 30. The above layout is relatively compact and advantageously provides a relatively high density non-volatile memory architecture.

It is always desirable to provide further improvements in non-volatile memory technology.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

In accordance with one aspect of the invention, a resistance changing memory unit cell is disclosed, and comprises a current control component operably associated with a sense bit line. The unit cell further comprises a resistance changing memory element coupled between the current control component and a word line.

According to another aspect of the invention, resistance changing memory is provided and comprises a current control component coupled to a sense bit line, and a resistance changing memory element coupled between the current control component and a word line. The memory further comprises a read sense circuit coupled to the sense bit line that is configured to determine a state of the resistance changing memory element. Further, the memory comprises a control circuit that is operably coupled to a control terminal of the current control component. The control circuit is configured to provide one of a plurality of differing control signals to the current control component when writing a state into the resistance changing memory element. The current control component provides current control local to the resistance changing memory element and thereby provides reliable programming independent of bit line capacitance.

According to yet another aspect of the invention, a resistance changing memory array architecture comprises an array of resistance changing memory unit cells. Each unit cell comprises a current control component and a resistance changing memory element operably coupled to the current control component. The array is arranged in columns and rows, wherein at least two adjacent columns of unit cells are coupled to a common sense bit line. A control line is individually associated with each column, and is coupled to a control terminal of each current control component of each unit cell along a respective column. A word line is individually associated with each row, and is coupled to the resistance changing memory element of each unit cell along the respective row.

In one aspect of the invention, the array architecture further comprises a sense circuit operably associated with a given common sense bit line. The sense circuit is configured to ascertain a data state of a unit cell along one of the two columns coupled to the common sense bit line by evaluating a current associated with the unit cell. The array architecture, in one aspect of the invention, also comprises a control circuit that is configured to independently provide control signals to the control lines of the two adjacent columns that are coupled to the common sense bit line. In one aspect of the invention, the control signals are based on a data value to be programmed into the respective resistance changing memory element.

According to still another aspect of the invention, a method of reading a resistance changing memory unit cell is provided. The method comprises applying a word line voltage to a word line of the unit cell, and applying a control line read voltage to a control line of the unit cell. The resistive state of the unit cell is then sensed. In further embodiment of the invention, the unit cell comprises a current control component coupled to a resistance changing memory element. The resistance changing memory element is coupled to the word line, and a control terminal of the current control component is coupled to the control line. Further, the current control component is coupled between the resistance changing memory element and the sense bit line. In this case, sensing comprises evaluating a current associated with the unit cell on the sense bit line.

According to yet another aspect of the invention, a method of programming a resistive-switched memory unit cell comprises applying a word line voltage to a word line of the unit cell, and applying a predetermined potential on a sense bit line of the unit cell. Further, the method comprises applying a control line program voltage on a control line of the unit cell, wherein the control line voltage dictates a programming current magnitude in the unit cell.

In one further embodiment of the invention, the unit comprises a current control component coupled to a resistance changing memory element, wherein the resistance changing memory element is coupled to the word line, and a control terminal of the current control component is coupled to the control line. Further, the current control component is coupled between the resistance changing memory element and the sense bit line.

According to another embodiment of the invention a diode-based resistance changing unit cell is disclosed. The memory unit cell comprises a resistance changing memory element coupled to a sense bit line and a diode coupled to the resistance changing memory element. In one embodiment, a plurality of such unit cells are organized to form a unit cell group that share a current control component. By sharing a current control component, each of the unit cells occupy less area, thereby making the core region of the memory array more compact. Each unit cell contains a diode that prevents current from a selected unit cell in the group from disturbing data within a non-selected unit cell within the group.

In one embodiment of the invention, the diode-based resistance changing memory cell comprises a unit memory cell containing a series connected memory element and diode coupled between a respective bit line and a local current bus. Other unit cells associated with a unit cell group are coupled between respective bit lines and the local current bus as well. A shared current control component is coupled between the local current bus and a word line. The current control component is activated during read operations to allow current to flow therethrough from a selected unit cell, wherein the current magnitude is a function of the data state of the selected unit cell. During write operations, the current control component selectively limits the current conducting through a selected unit cell in the unit cell group, wherein the limit operation is a function of whether the write is an erase operation or a program operation. The current limit component further provides a plurality of different current limit values based on a desired data state when the write function comprises a program operation, wherein each different current limit value is associated with a unique data state.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
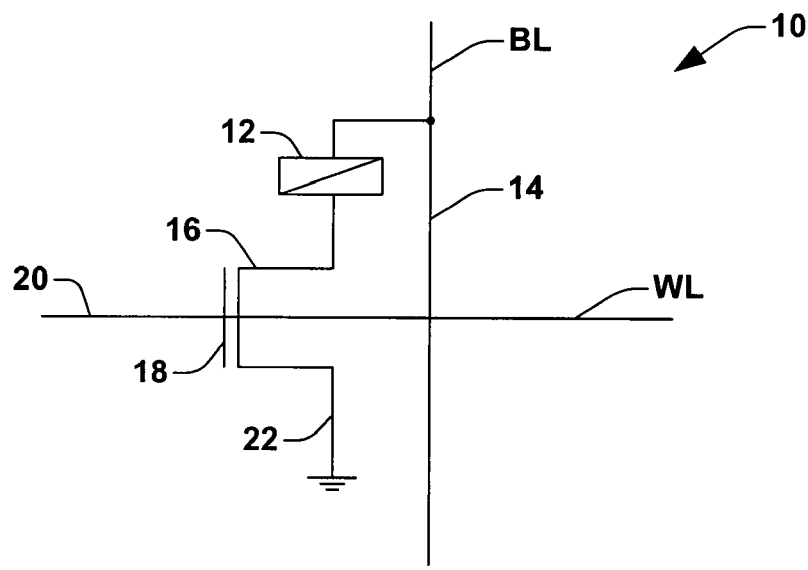
FIG. 1 is a prior art schematic diagram illustrating a resistance changing unit cell configured in a conventional NOR type non-volatile array architecture.
Figure 2:
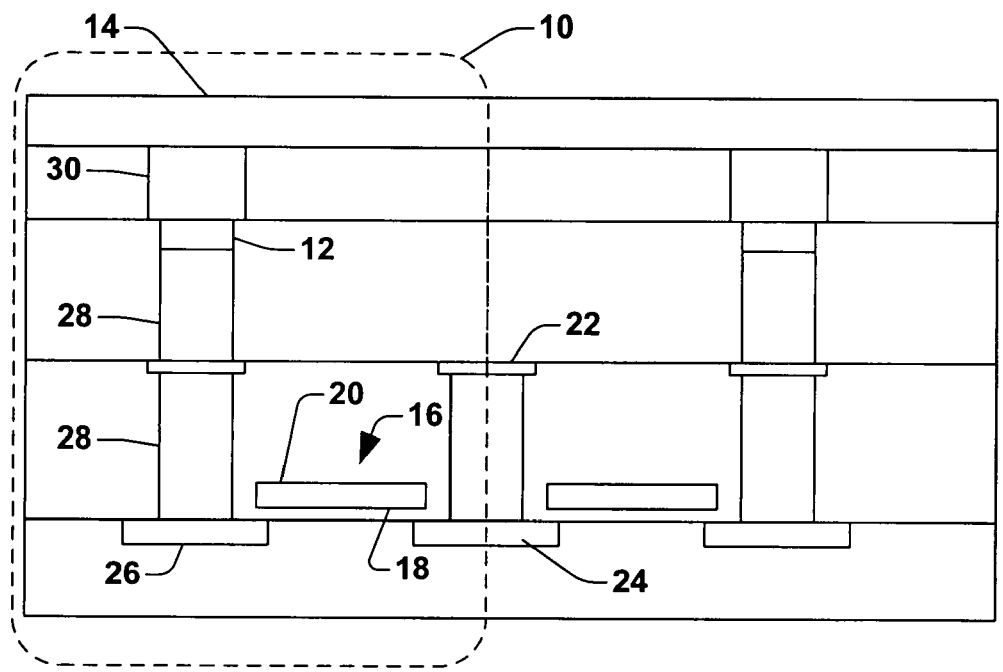
FIG. 2 is a prior art fragmentary cross section illustrating the resistance changing unit cell of prior art FIG. 1 configured in a NOR type non-volatile array architecture.

One or more implementations of the present invention will now be described with reference to the drawings, wherein like reference numerals are used to refer to like elements throughout. The invention is directed to a resistance changing memory architecture and addressing methodology associated therewith.

In order to more fully appreciate various aspects of the invention, a more thorough discussion of the prior art and some of the limitations associated therewith that were discovered and appreciated by the inventor of the present invention will be discussed below.

Figure 3:
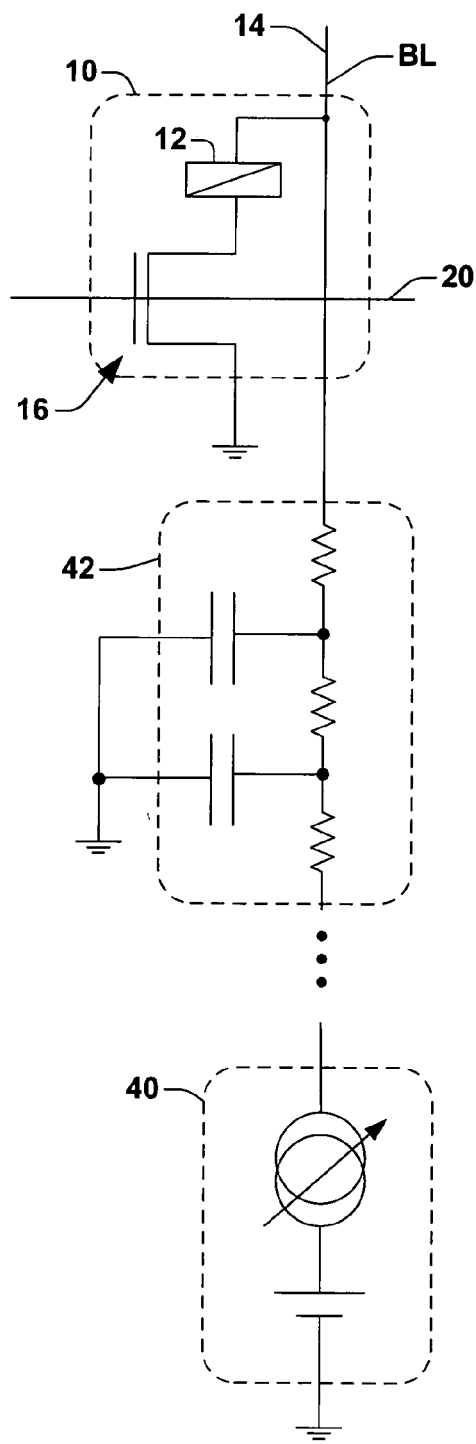
FIG. 3 is a prior art schematic diagram illustrating a bit line of a resistance changing memory configured in a conventional NOR type non-volatile array architecture.

Referring to FIG. 3, a bit line 14 is illustrated, wherein one of a plurality of unit cells 10 is illustrated being coupled thereto. In addition, a current limit circuit 40 is coupled to the bit line to effectuate a programming of the resistance changing element 12 as will be discussed in greater detail below. In addition, each bit line 14 has a parasitic capacitance associated therewith, and is illustrated in FIG. 3 at reference numeral 42. The current limit circuit 40 operates to limit an amount of current that can flow in the bit line 14, so as to enable the resistance changing element to be programmed to one of a plurality of different resistance levels corresponding to differing data states.

Figure 4:
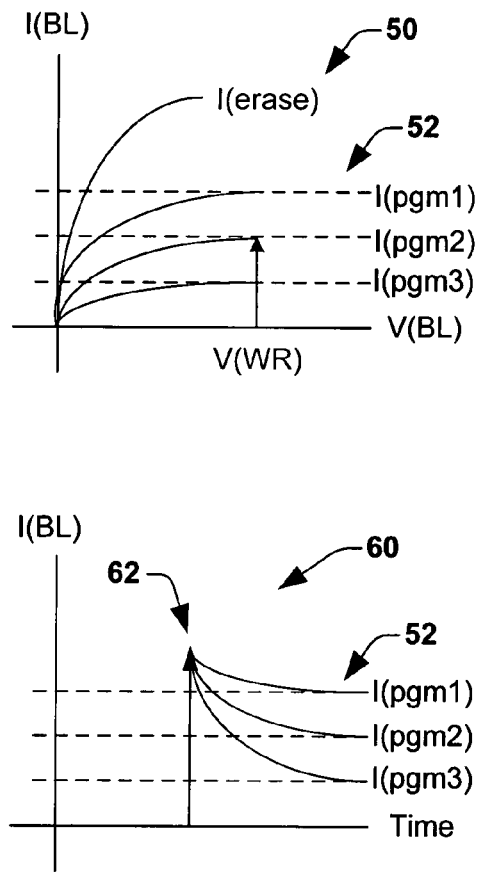
FIG. 4 are graphs illustrating various operating characteristics associated with the resistance changing array architecture of prior art FIG. 3.

As highlighted in a first graph 50 of prior art FIG. 4, to write data to a data element, the bit line 14 of FIG. 3 is brought to a particular write voltage ($V_{WR}$) and the word line 20 associated with the unit cell 10 is activated by going high, thereby turning on the select transistor 16. Because the select transistor 16 is turned fully on by the word line voltage, the transistor does not play a role in limiting the current to the resistance changing element 12. Consequently, the current limit circuit 40 of FIG. 3 is employed to limit the bit line current $I_{BL}$ to one of a plurality of different values 52 based on the data state to be written. In the example, illustrated in the graph 50, three different program current limits are illustrated, wherein the amount of current through the resistance changing element 12 serves to fix the state of the element. A fourth state may also exist in this example, wherein the current limit circuit 40 operates to not limit the current in order to erase the cell (not shown).

While not intending to be limited to any particular theory of operation, in a metal-insulator-metal resistance changing element type of resistance changing device, the switching of the binary metal oxide insulator material appears to comport with a space-charge-limited-conduction (SCLC) model. In this model, for a solid material with unfilled deep-level traps, the current therethrough is substantially less than a case where the traps are filled. The current increase occurs when the deep-level traps are filled at the traps-filled limit voltage that is a function of the unfilled trap density. Therefore, one can summarize the variable resistance of the material generally by stating that the existence of unfilled deeps traps increases the resistance, while the resistance decreases gradually or incrementally as the traps get filled, and ultimately reaches a limit at the trap-filled limit voltage.

Relaying the above to the discussion with respect to prior art FIGS. 3 and 4, by limiting the current for different write conditions, differing amounts of traps are being filled in the resistance changing element 12, thereby causing a unique resistance state associated with a desired data state.

However, still referring to FIG. 4, the desired operation at graph 50 does not typically or repeatedly occur in the NOR type architecture configuration of prior art FIG. 3. The inventor of the present invention identified that deviations from the behavior at 50 occur due to the bit line capacitance 42 of FIG. 3. Due to the bit line capacitance 42, in some cases instead of the current being limited properly by the current limit circuit 40, the bit line capacitance is large enough to cause an overshoot in the current, as illustrated at graph 60 in FIG. 4. Although the current ultimately settles down to the proper limit values 52, the overshoot 62 due to the bit line capacitance causes a loss in the requisite current resolution, thereby resulting in the potential for errors in writing data to the various memory cells.

The location of the current limit circuit 40 being, in some instances, relatively far away from the unit cell 10 of interest causes the bit line capacitance to be a problem. One solution considered by the inventor to reduce the effect of bit line capacitance on programming reliability was to use the select transistor 16 within the NOR architecture unit cell 10 as a current limit device. By definition, each memory element 12 would therefore have its own local current limit circuit and thereby negate any negative impact of bit line capacitance during programming.

Figure 5:
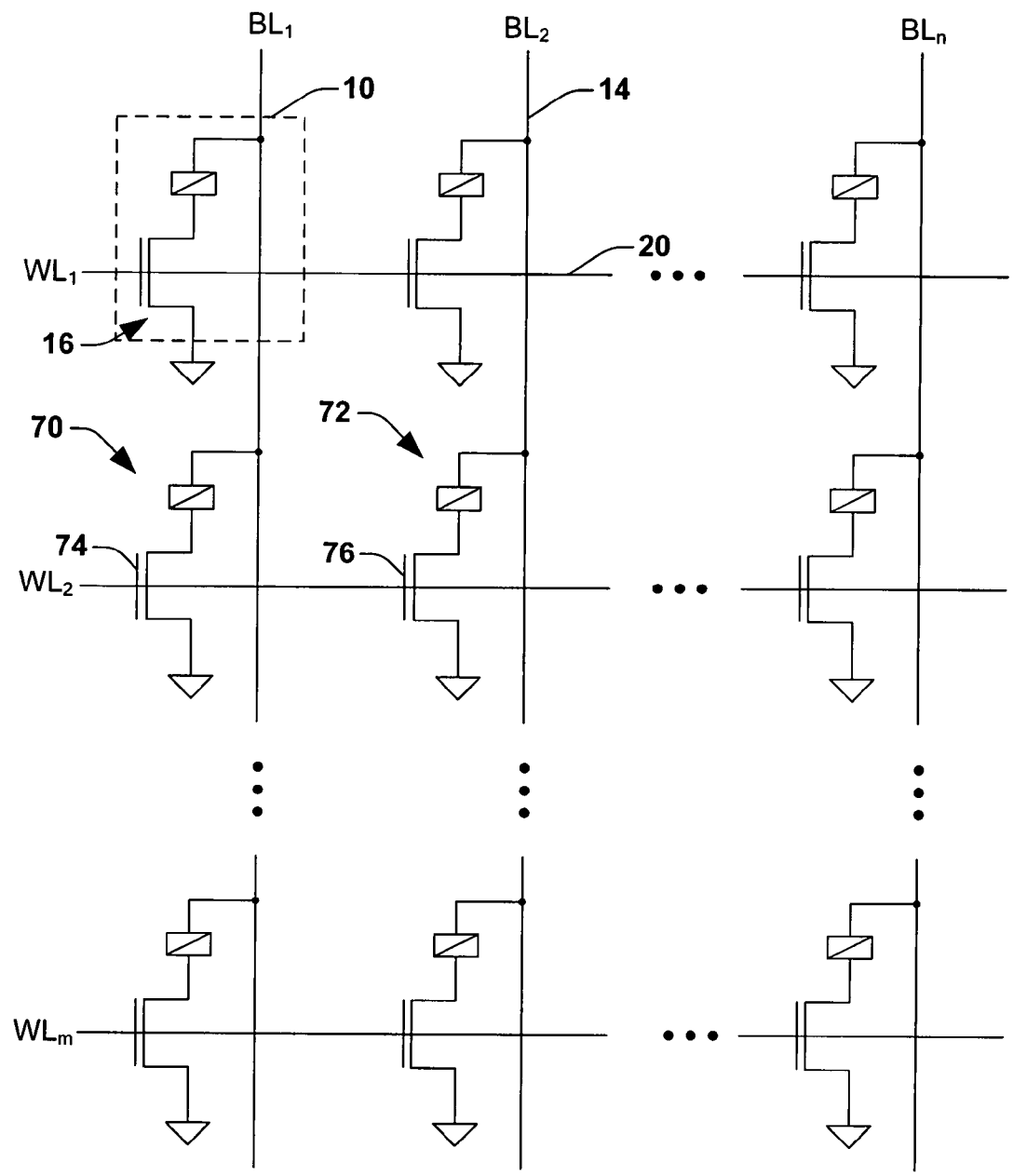
FIG. 5 is a schematic diagram illustrating an array portion of resistance changing memory in a conventional NOR type array architecture illustrating a limitation of the prior art.

Such a solution is shown in prior art FIG. 5. However, such a solution in the illustrated NOR type architecture results in sever limitations in programming performance. As can be appreciated, the architecture of FIG. 5 prohibits a page mode programming function, wherein multiple cells along a given word line 20 are programmed in a concurrent fashion. For example, if cells 70 and 72 along $WL_2$ were to be programmed concurrently, but the data being written to the cells were different, the operation could not occur. This problem occurs because if the respective select transistors 74 and 76 for each cell are acting to limit the current to differing current values, the word line voltage cannot be the same for both cells, and consequently, they cannot be coupled together via the common word line WL2, as is required in a NOR architecture. It was this appreciation of the shortcomings in the prior art that aided in the development of the architecture of the present invention.

Figure 6:
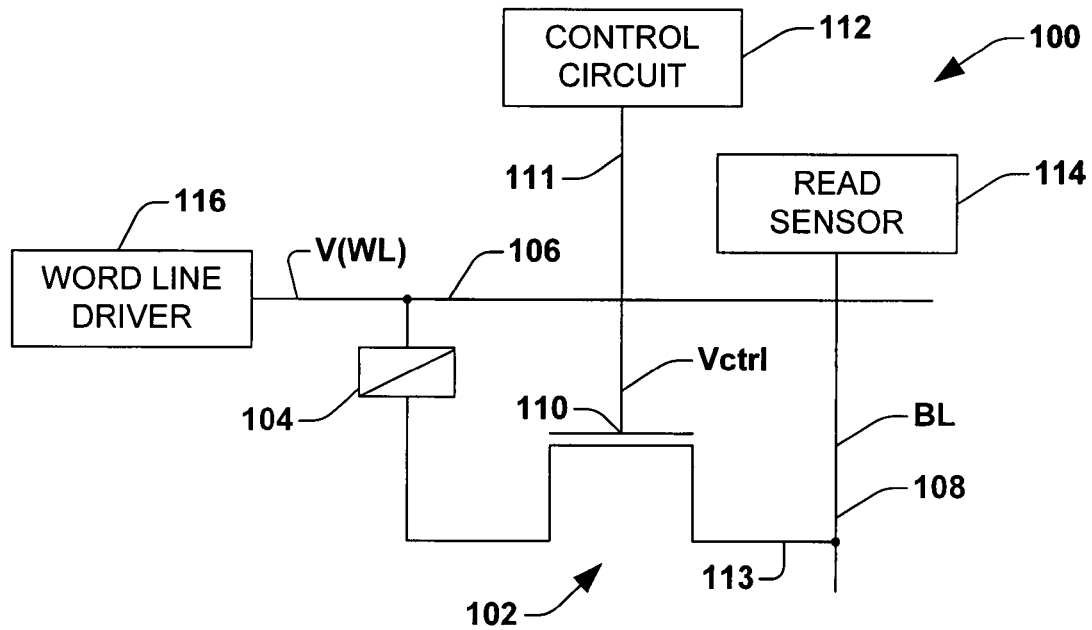
FIG. 6 is a combined block/schematic diagram illustrating a resistance changing memory unit cell according to one embodiment of the invention.

Turning now to FIG. 6, a resistance changing unit cell 100 is provided according to one embodiment of the invention. The unit cell 100 comprises a current control component 102 coupled to a resistance changing element 104. In contrast with conventional unit cells, the unit cell 100 of the present invention has the resistance changing memory element 104 coupled to a word line 106 rather than a sensing bit line 108. Further, in contrast to conventional unit cells, a control terminal 110 of the current control component 102 is coupled to a control circuit 112 via a control line 111 rather than to the word line 106, and another terminal 113 coupled to the bit line 108. A read sensor circuit 114 is operably coupled to the bit line 108, while a word line driver circuit 116 is operably coupled to the word line 106.

As can be seen in FIG. 6, the unit cell 100 of the present invention does not couple or arrange with other unit cells in a memory array in a NOR type architecture. Accordingly, in the arrangement 100 of FIG. 6, the current control component 102 is very close to the resistance changing element 104, and thus the bit line capacitance will not adversely affect the programming of the memory element. In one embodiment of the invention, the current control component 102 comprises an NMOS transistor, however, any type of current control component or circuit may be employed and is contemplated as falling within the scope of the present invention. In another non-limiting example, the component may comprise a PMOS or bipolar device, or any other form of variable switching or current limiting component or circuit.

The operation of the unit cell 100 of FIG. 6 according to one exemplary aspect of the invention will be explained in conjunction with the graph provided in FIG. 7. When programming the resistance changing element 104, the control circuit 112 provides a control signal on line 111 to the control terminal 110 of the current control component 102. Depending on the control signal, the amount of current that may pass therethrough (and through the resistance changing element 104) is controlled. Concurrently, the word line driver circuit 116 provides a program voltage (V(WL, pgm)) on the word line 106.

When the control circuit 112 intends to program the resistance changing element 104 to a "level 1" state, the control circuit 112 provides a control signal (V(ctrl, pgm1)) to the control terminal 110 of the current control component 102. This control signal causes the current control component 102 to conduct, but to limit the current conduction to a limit value 120, as illustrated in FIG. 7. Consequently, the requisite current needed to program the resistance changing element 104 to the "level 1" state is permitted to conduct therethrough, thereby effectuating the desired programming. Similarly, if different levels such as "level 2" or "level 3" are desired for programming, the control circuit 112 provides a different control signal to the control terminal 110 of the current control component 102 via control line 111. Accordingly, the current control component 102 limits current conduction to appropriate levels 122 or 124, respectively.

As highlighted above, due to the proximate location of the current control component 102 with respect to the resistance changing element 104 being programmed, no overshoot occurs during programming due to the bit line capacitance. Consequently, the programming described above is achieved in a repeatable, reliable manner, wherein the respective target program current levels 120, 122, 124 are not exceeded. In each of the above program operations, the bit line 108 is held at a predetermined potential, such as circuit ground in one embodiment.

Figure 7:
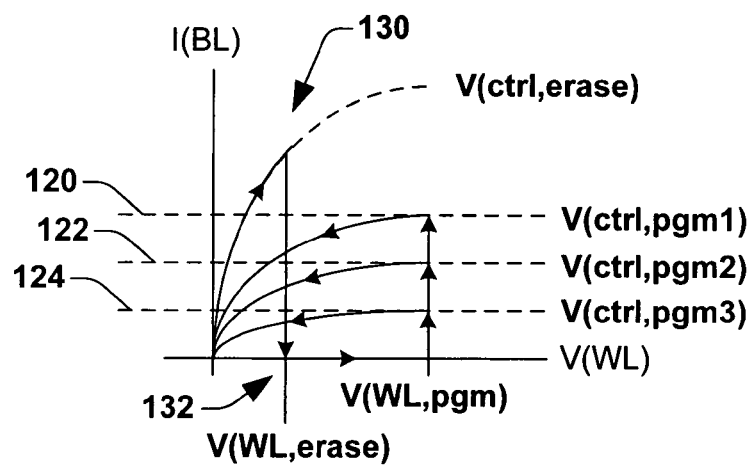
FIG. 7 is a voltage/current diagram illustrating one or more operating states of the resistance changing memory unit cell of FIG. 6 according to an embodiment of the invention.

Still referring to FIGS. 6 and 7, in the case of an erase operation, the word line driver circuit 116 provides an erase voltage (V(WL, erase)) on the word line 106 and the control circuit 112 provides a control signal (V(ctrl, erase)) to the current control component 102, which causes the current control component 102 to not provide any substantial limit to the current through the resistance changing element 104. In this case, the current rises quickly, as illustrated at 130 in FIG. 7. At some current level, however, the heat in the element 104 due to the power dissipation caused by the elevated current therethrough, causes the trapped charge therein to become dislodged, thereby making the deep traps unfilled which then substantially alters the resistance changing material resistance to an OFF state (high resistance value), as shown at 132.

Figure 8:
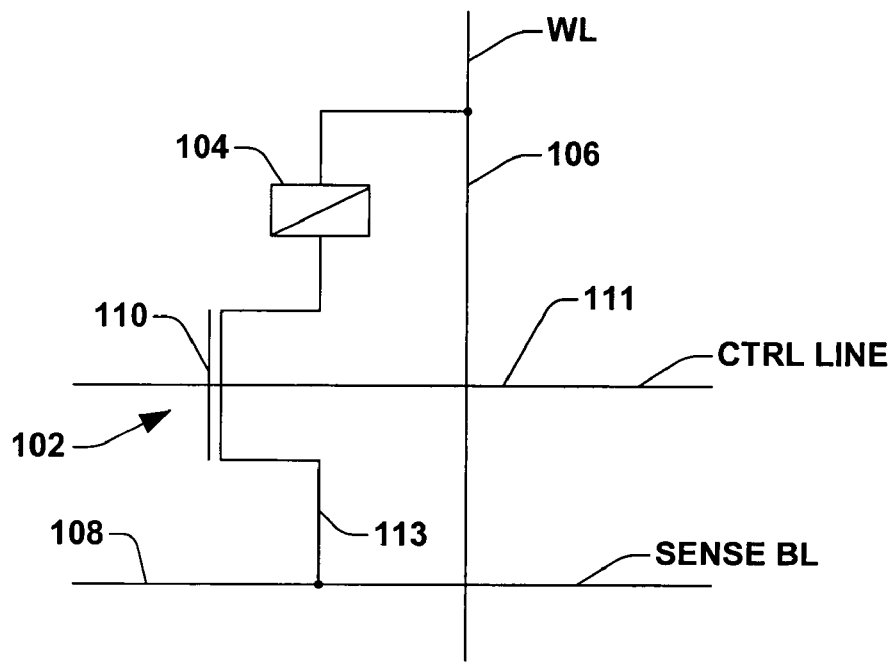
FIG. 8 is a schematic diagram illustrating the resistance changing memory unit cell of FIG. 6 in another orientation in order to facilitate an understanding of various differences between the present invention and the prior art.
Figure 9:
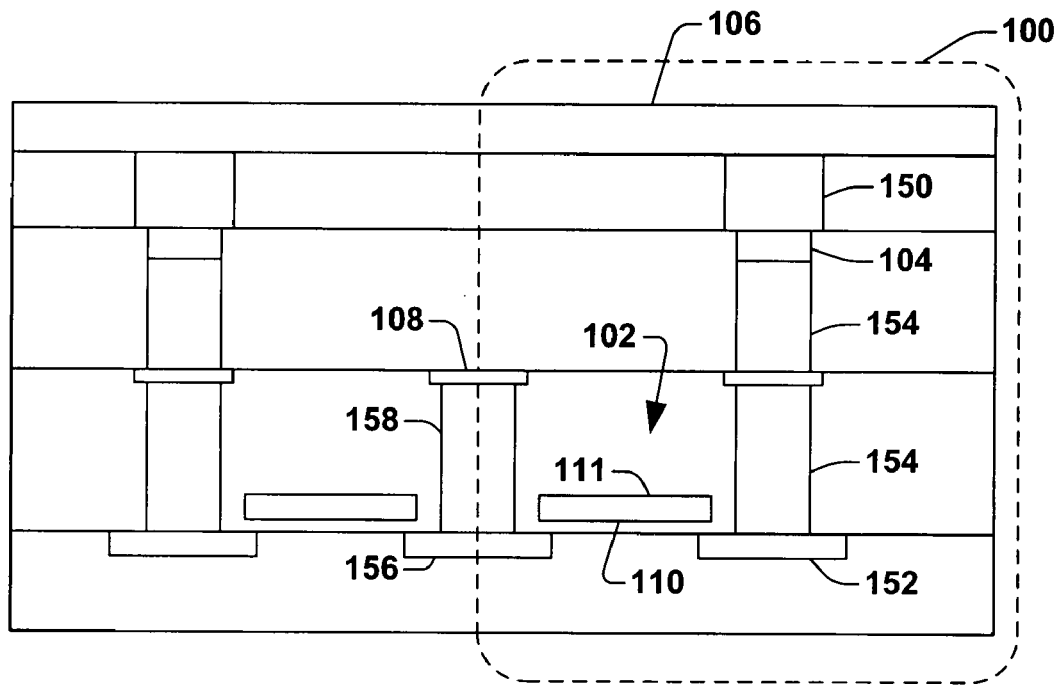
FIG. 9 is a fragmentary cross section diagram illustrating the resistance changing memory unit cell of FIGS. 6 and 8 according to an embodiment of the invention.

FIGS. 8 and 9 are enclosed to provide further clarity in appreciating various aspects of the invention, and the distinctions between various aspects of the invention and the prior art. FIG. 8 is another illustration of the unit cell 100 of FIG. 6 with a different orientation. This orientation illustration is provided to help further appreciate the differences over the prior art, and to help understand how a unit cell may be coupled together with other unit cells in an array, according to one embodiment of the invention. FIG. 9 shows a cross section of the unit cell 100 according to one exemplary embodiment. As seen in the figure, the word line 106 is coupled to the resistance changing element 104 via a contact 150, as opposed to being coupled to the gate of the select transistor. The drain 152 of the transistor 102 is coupled to the resistance changing element 104 through contacts 154, while the source 156 is coupled to the sense bit line 108 through a contact 158. Further, the control terminal 110 is coupled to the control line 111 (not shown).

Figure 10:
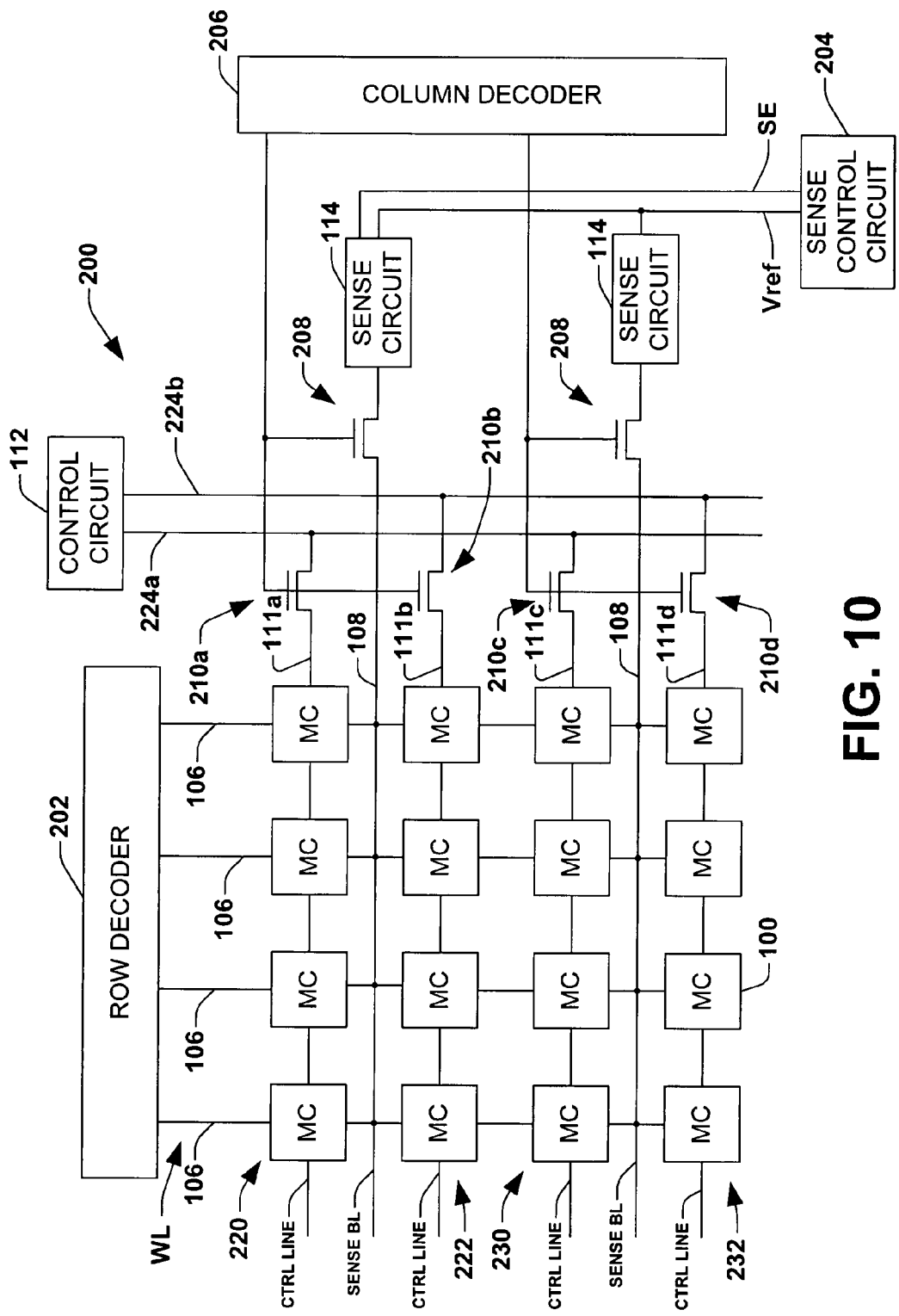
FIG. 10 is block/schematic diagram illustrating an array architecture of the resistance changing memory according to another embodiment of the present invention.

Turning now to FIG. 10, an array portion 200 is illustrated in accordance with one embodiment of the invention. In the array portion 200, various memory unit cells (MC) 100 are organized in a plurality of rows and columns associated with the word line 106 and control line 111, respectively. As can be seen in the example of FIG. 10, two neighboring rows of cells share a single sense bit line 108 in this exemplary embodiment. While the array portion of FIG. 10 illustrates a 4×4 array, it should be understood that any "n×m" array may be employed, and all such variations are contemplated as falling within the scope of the invention.

As can be seen in FIG. 10, one or more word lines 106 can be selected for addressing selected cells in the array via a row decoder circuit 202. Similarly, cells can be read along one or more sense bit lines 108 via sense circuits 114 and a sense control circuit 204 with the aid of a column decoder circuit 206 and selection transistors 208. For write operations, the column decoder 206 operates with selection devices 210a-210d and the control circuit 112 to generate appropriate write control signals to the respective unit cells 100.

More particularly, in a read operation the word line 106 of the unit cell 100 being addressed is raised to a modest voltage, for example, 0.5V in one embodiment. In one embodiment the word line voltage is large enough to allow conduction through the unit cell, but not so high as to create the possibility of the read voltage on the word line causing a read disturb on another non-selected cell coupled to that word line. Further, a read control voltage is placed on the control line 111 so that the transistor 102 turns fully on. In this manner the current magnitude flowing through the unit cell 100 is attributable primarily to the resistance state of the resistance changing element 104. Concurrently, the sense bit line 108 associated with the unit cell 100 is allowed to float. In one embodiment of the invention, a precharge circuit may be employed to pre-charge the sense bit line 108 to a predetermined potential such as circuit ground prior to being permitted to float during the read operation. The current on the sense bit line 108 is then sensed with a read sensor or circuit 114, wherein the current magnitude is indicative of the state of the resistance changing element.

Referring to the array architecture 200 in FIG. 10, data can be read along the multiple sense bit lines 108 in a concurrent fashion. In one example, the read operation along a single sense bit line 108 will be described, however, concurrent reads along multiple sense bit lines may be performed according to the invention. A read operation can operates as follows. If column 220 is selected to be read, the column decoder 206 activates transistor 208 to coupled the sense bit line 108 to the sense circuit 114, and activates transistors 210a and 210b. In the above manner the control lines 111a, 111b are both coupled to respective lines 224a, 224b of the control circuit 112. In the above example, the control line 224a is high, thereby activating the transistors 102 in each unit cell 100 along column 220, while line 224b is held low, thereby deactivating the transistors 102 in each unit cell 100 along the column 222. In the above manner, each unit cell 100 along the unselected column 222 is isolated from the sense bit line 108. The row decoder circuit 202 then proceeds to sequence a read voltage on the respective word lines 106, so that each unit cell 100 in the column 220 is read in a predetermined order. In the above example, four cells are illustrated along the column 220 with the sense circuit 114. Alternatively, substantially more unit cells may be associated with the sense circuit 114. Further, multiple sense circuits 114 may exist along a given column, wherein the sense bit line may be accordingly segmented for the multiple sense circuits along the column, and wherein the column decoder 206 is configured to couple them to control lines and sense bit lines along the column.

After the first column 220 is read in a sequential fashion, the control circuit 112 switches the voltages on the control signals 224a, 224b so that the column 220 is isolated from the bit line 108, while the unit cells 100 along the column 222 are sequentially read by a sequencing of the word lines via the row decoder 202. Concurrently with the reading of columns 220 and 222, the reading of columns 230 and 232 occur in a similar fashion. In the above manner, multiple columns of unit cells can be concurrently read in a sequential fashion. In another exemplary embodiment each column may have their own dedicated read circuit.

Figure 11:
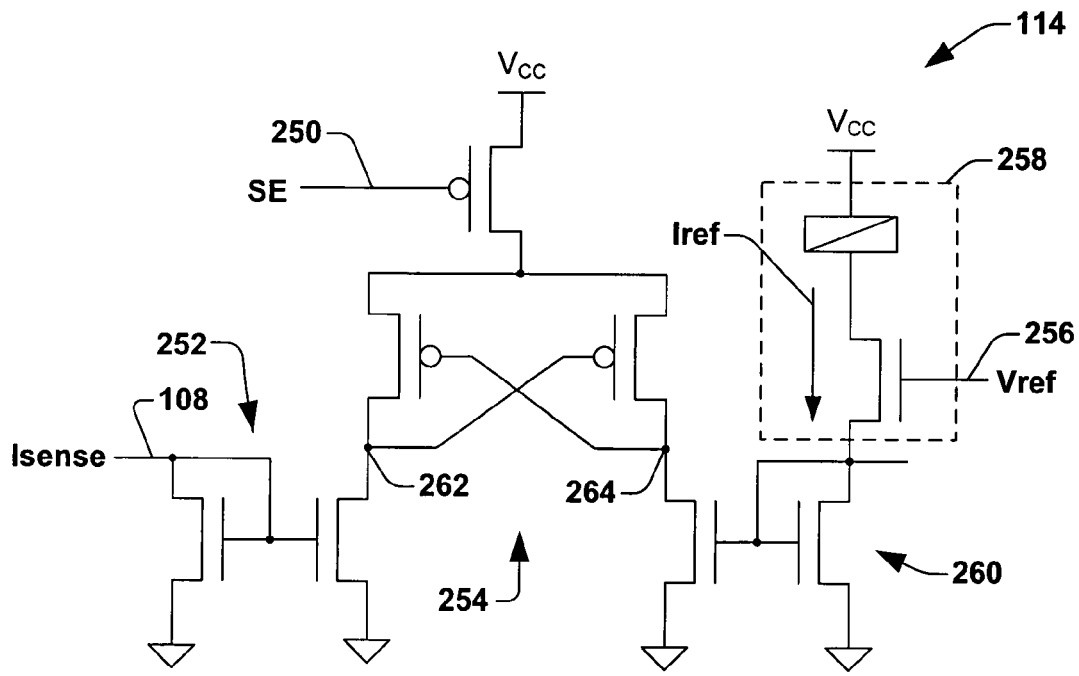
FIG. 11 is a schematic diagram illustrating a read sense circuit for use in reading data states of the resistance changing memory according to one embodiment of the invention.
Figure 12:
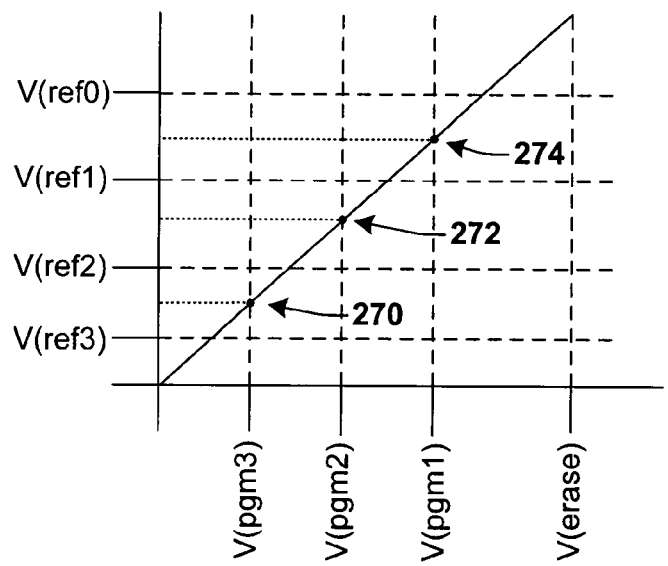
FIG. 12 is a graph illustrating read conditions for ascertaining a data state of a resistance changing memory using the read sense circuit of FIG. 11 according to one embodiment of the invention.

Turning to FIGS. 11 and 12, a circuit 114 for reading the data states of the resistance changing memory elements 104 is provided according to one embodiment of the invention. The read sensor or sense circuit 114 receives a sense enable signal 250 from the sense control circuit 204 of FIG. 10. When the signal is high the sense circuit 114 is deactivated, and when it is low, the sense circuit is enabled in this example. The sense circuit 114 receives a sensed current (Isense) on an input sense bit line 108 and mirrors the input current via an input current mirror circuit 252 over to a data latch circuit 254. Concurrently, a voltage reference signal 256 is received by the sense control circuit 204 at a dummy unit cell 258. Based on a value of the reference signal 256, a reference current (Iref) flows to a reference current mirror circuit 260, which mirrors the reference current over to the latch 254, having output nodes 262 and 264, respectively. Based on the relative magnitudes of the mirrored currents at the latch, the output nodes 262, 264 latch in opposite direction, wherein information can be gleaned regarding the data state of the cell being read. For example, in reference to FIG. 12, if Isense is greater than Iref when Vref is equal to (Vref3), then node 262 goes low and node 264 is pulled high. If Vref is then increased to Vref2 and node 262 gets pulled high, and node 264 gets pulled low, then the data state of the queried cell is at "level 3", as illustrated at 270 of FIG. 12. Alternatively, if node 262 stays low and node 264 stays high, Vref is again increased to Vref1 and the output nodes 262, 264 are again evaluated. If the nodes switch, then the data state is "level 2", as illustrated at 272 in FIG. 12. If, however, the nodes 262, 264 again do not switch, then Vref is again increased to Vref0, wherein the output nodes are again evaluated. If the output nodes switch, then the data state is "level 1" as shown at 274. If no switching occurs, then it is determined that the memory element is in the "erased" state.

With regard to a write or programming operation, reference is initially made to FIGS. 6-8. Initially, if it is determined that the data to be written to a unit cell 100 is not an erase condition, the word line driver circuit 116 places a program voltage (V(WL, pgm)) on the word line 106 associated with the respective unit cell 100. Concurrently, the sense bit line 108 is coupled to a predetermined potential, such as circuit ground in one embodiment. The control circuit 112 provides an appropriate control signal on the control line 111 based on the desired program level. For example, if the desired program state is "level 1", the control signal (V(ctrl, pgm1)) dictates to the current control component to limit the program current through the resistance changing element 104 to the level 120 illustrated in FIG. 7. Alternatively, if different program levels are desired, the control circuit 112 outputs a different, appropriate control signal (e.g., V(ctrl, pgm2), V(ctrl, pgm3)) to the current control component 102. Although a transistor is employed as the current control component 102 in the embodiments illustrated in FIGS. 6 and 8, it should be understood that any such current limiting component or circuit may be employed and is contemplated as falling within the scope of the present invention.

If the desired program level is an "erase" state, the word line driver 116 generates an erase word line voltage (V(WL, erase)) on the respective word line 106 (such as 132 in FIG. 7), while the sense bit line 108 is again held at a predetermined potential such as circuit ground. The control circuit 112 then provides an appropriate control voltage (V(ctrl, erase)) to the current control component 102, wherein the current through the resistance changing element 104 is substantially not limited. As can be seen at 130 in FIG. 7, as the current rapidly increases, heat due to the power dissipation also increases. It is believed that at some current threshold or limit, the deep traps in the resistance changing material that were filled to some extent previously become empty, causing the resistance to greatly increase, thereby placing the resistance changing element 104 in an "off" or "erase" state.

As can be seen in FIGS. 6 and 8, because the current limit component 102 is extremely close physically to the resistance changing element 104 being programmed, the bit line capacitance does not cause any current overshoot during programming. Consequently, the programming of the resistance changing memory element 104 can be programmed to one of a multiple of different data states in a reliable fashion.

In reference to the architecture 200 of FIG. 10, initially the sense circuit 114 is disabled by the sense control circuit 204, for example, by pulling the sense enable signal SE high in one embodiment. In the embodiment illustrated, the control circuit 112 provides two independent control lines 224a and 224b that are selectively coupled to respective columns (e.g., 220 and 222) via transistors 210a, 210b, respectively, associated with a given sense bit line 108, that is coupled to a predetermined potential such as circuit ground during a programming operation. Consequently, in this illustrated embodiment, two columns can be programmed in a concurrent fashion. In other embodiments, a greater number of independent control lines 224 may be provided, thereby facilitating a larger number of columns to be programmed in a concurrent fashion. This concurrent program capability serves as a significant advantage over the limitations of the prior art architecture.

In the above embodiment, columns 220 and 222 are programmed in a concurrent manner while the columns 230 and 232 are isolated therefrom. The isolation of the non-selected columns 230 and 232 is performed in one embodiment by the column decoder circuit 206 turning off the transistors 210c and 210d, thereby isolating the control signals 224a, 224b from the control lines 111c and 111d thereof from the control circuit 112. The selected columns 220 and 222 are selected by the column decoder 206 by turning on the transistors 210a and 210b, to thereby couple the control lines 111a and 111b of the columns 220 and 222 to the respective control lines 224a, 224b of the control circuit 112.

In one embodiment, each of the unit cells 100 along a selected column is then programmed sequentially in some predetermined fashion, for example, from one end of the column to another. For example, again referring to FIG. 7, the row decoder circuit 202 places a program voltage (V(WL, pgm) or V(WL, erase)) on one selected word line 106 (based on whether cell is to be programmed or erased), while the word lines of the other units cells on the selected column are maintained at a predetermined potential such as ground to discourage current conduction therethrough. The control circuit 112 then provides a unique control signal on the respective control line 111 to program the resistance changing element 104 in the selected unit cell 100 to the desired state. For example, if the data state to be programmed is "level 2", the control circuit 112 provides the appropriate control signal (V(ctrl, pgm2)) to the proper control line (e.g., line 224a), wherein the control signal dictates the current magnitude conducting through the selected unit cell 100. The process then moves to the next unit cell, wherein the word line for that cell is raised to the proper level while the word line for the previously programmed cell is brought down to the predetermined potential such as ground.

While the above program operation is occurring with the selected column 220 in the predetermined sequence, a concurrent programming of the other selected column 222 is being performed via the other independent control line 224b from the control circuit 112. In the above manner, two columns are programmed concurrently, rather than being limited to programming one column at a time. As highlighted above, in an alternative embodiment of the invention, additional independent control lines 224 are provided, facilitating the concurrent programming of an additional number of columns, and such alternatives are contemplated as falling within the scope of the present invention.

In another embodiment of the invention, a control routine executed by the row decoder circuit 202 and the control circuit 112 may be employed to concurrently program multiple unit cells 100 along a selected column that are to be programmed to the same level. For example, if column 220 is the selected column, and three of the four illustrated unit cells 100 are to be programmed to the same level such as "level 1", then the control circuit 112 provides the program control signal (V(ctrl, pgm1)) while the row decoder circuit 202 provides the proper word line voltage (V(WL, pgm)) to the word lines associated with the three unit cells in a concurrent fashion. In the above manner, multiple unit cells 100 along a given column can be programmed at the same time if desired. While this programming routine may have speed advantages for a single column, such a routine is likely not advantageous for use in the concurrent programming of multiple columns, since the row decoder 202 will be raising word lines 106 of unselected cells for other columns, and this may cause, in some cases, some level of program disturb for unselected cells. However, the present invention does not preclude this programming methodology.

After the selected columns 220 and 222 have been programmed, the column decoder 206 de-selects the columns by turning off the transistors 210a, 210b, and selects the next group of columns 230 and 232 for programming by turning on the transistors 210c, 210d. The above programming routine described above in conjunction with columns 220 and 222 can then be repeated for the newly selected columns 230 and 232.

Figure 13:
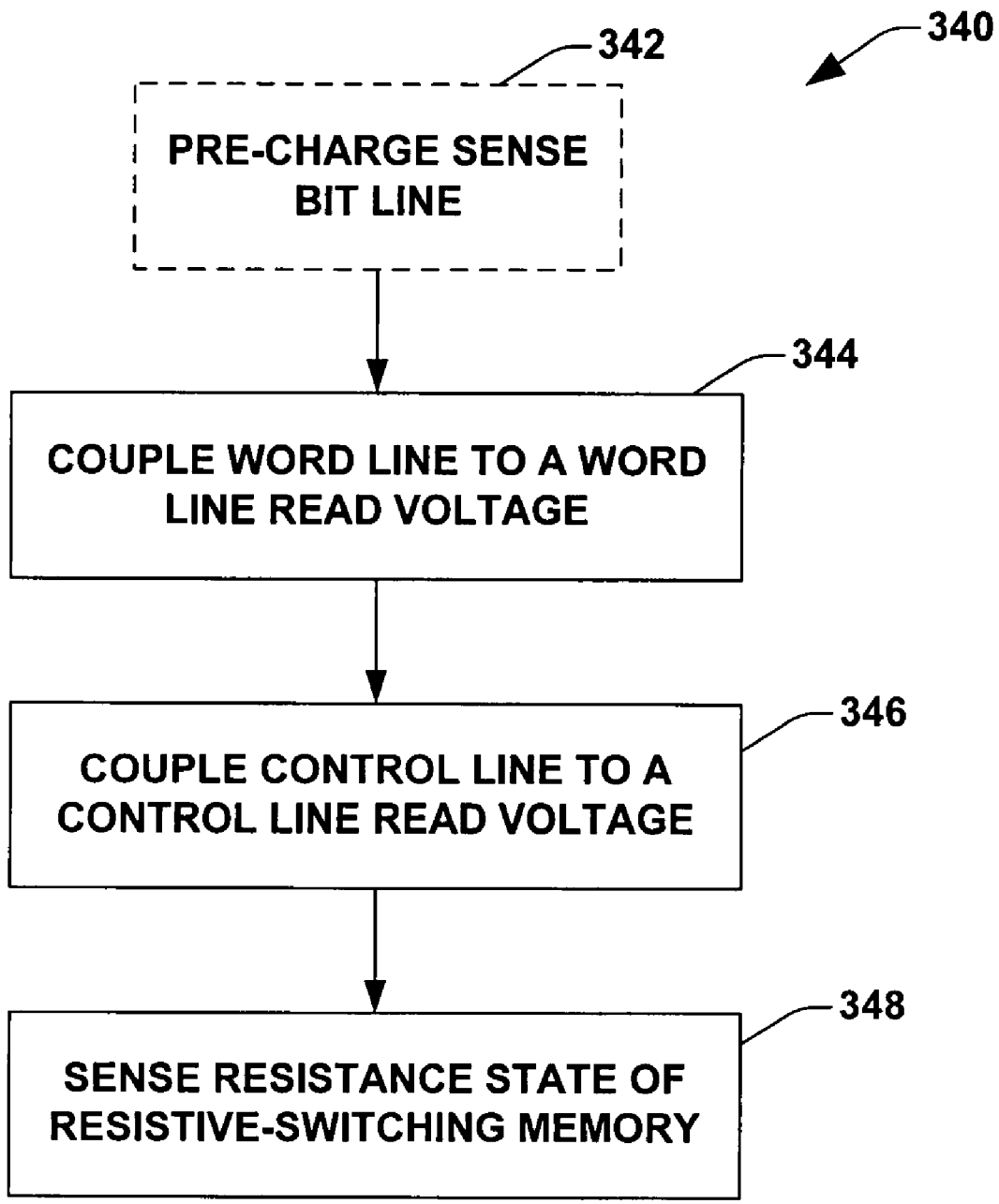
FIG. 13 is a flow chart diagram illustrating a method of reading a resistance changing memory unit cell according to another aspect of the invention.
Figure 14A:
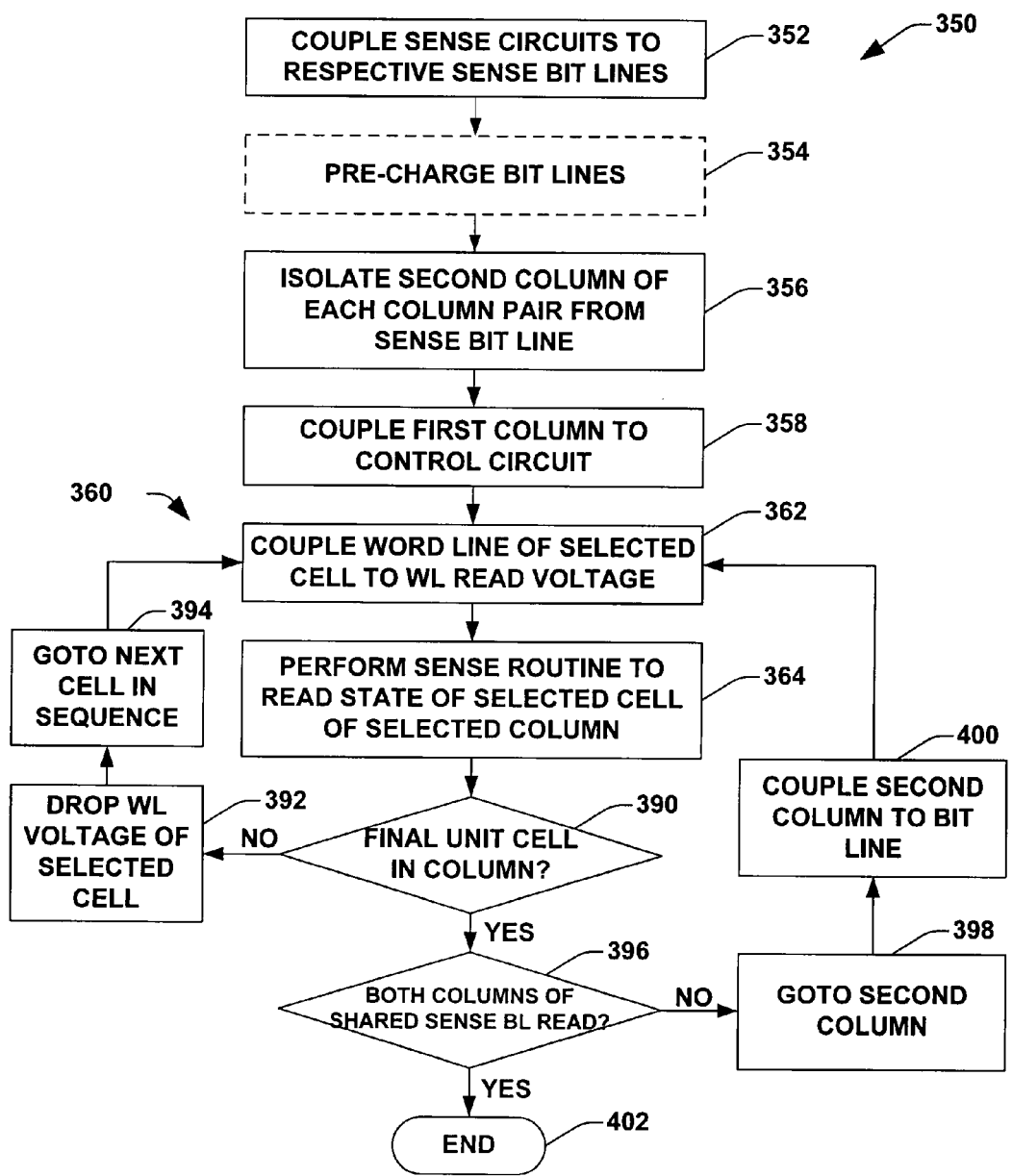
FIGS. 14A-14B are flow chart diagrams illustrating a method of reading data in the resistance changing memory array architecture of FIG. 10 according to still another aspect of the invention.
Figure 14B:
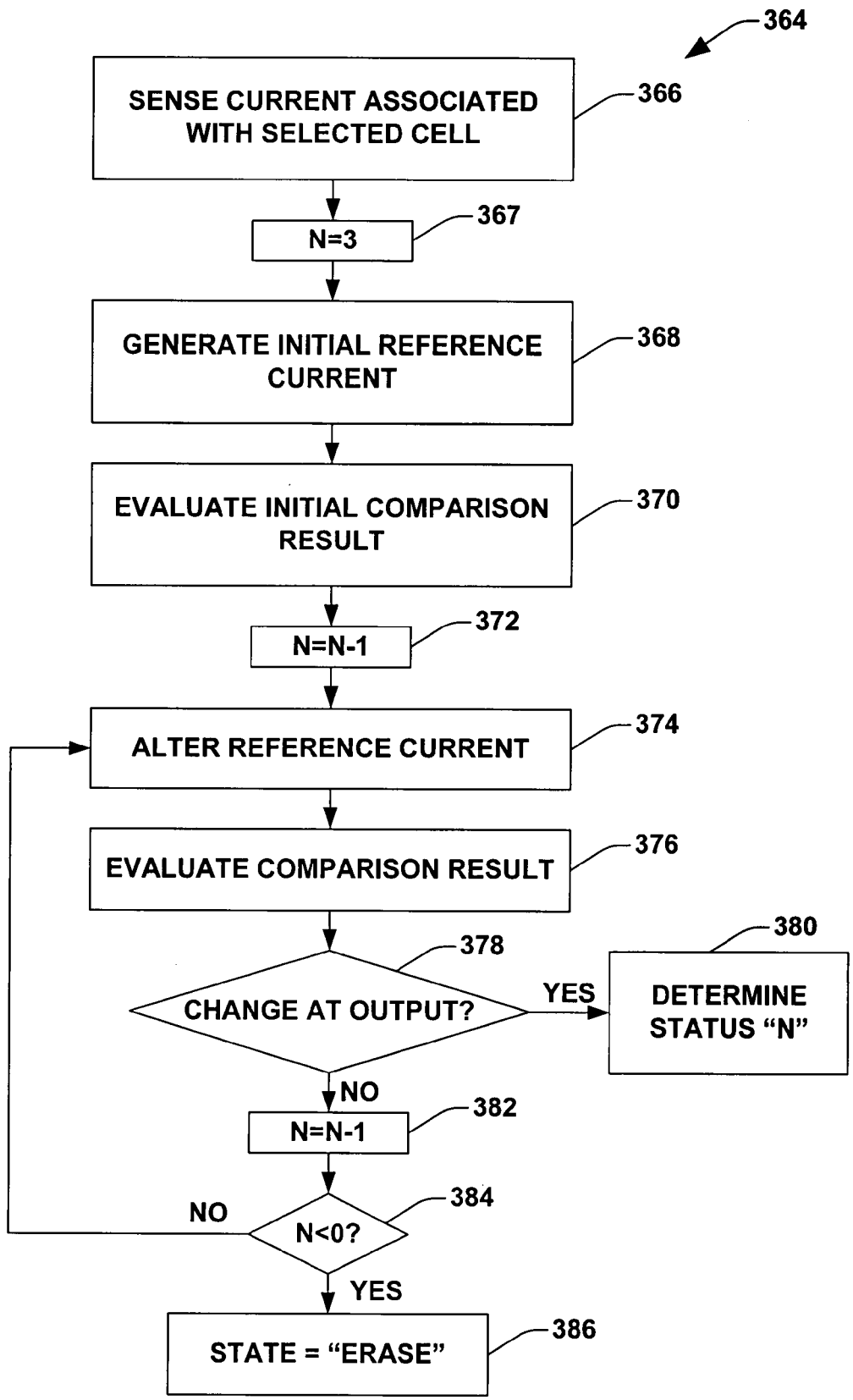

Turning now to FIGS. 13 and 14A-14B, a methodology 340 for reading an individual unit cell and a methodology 350 for reading such units cells in the architecture of FIG. 10 is provided. Although the methods 340 and 350 are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated.

Initially, at 342 an optional precharge of the sense bit line 108 associated with the cell being read is performed. In one embodiment, the sense bit line 108 is pre-charged to a predetermined potential such as circuit ground in one example. After, the pre-charged bit line is permitted to float. The method 340 then proceeds, and at 344 the word line 106 associated with the unit cell being read is coupled to a word line voltage. In one embodiment of the invention, the word line voltage is sufficiently high to ensure adequate conduction that reflects the state of the resistance changing element being sensed, and concurrently is low enough to other cells associated with the word line 106 are not disturbed. In one example, the word line read voltage is about 0.5V.

Continuing with the method 340, the control line 111 associated with the selected unit cell 100 is coupled to a control line read voltage at 346. As discussed above with respect to FIG. 6, for example, the control line read voltage is a voltage that sufficiently activates the current control component 102 to not act to limit the current in the unit cell. In one embodiment, the current control component 102 comprises a transistor, and the control line read voltage is a voltage that fully activates the transistor. At 348 the state of the resistance changing element 104 of the unit cell 100 is sensed by sensing the current conducting therethrough. In one embodiment of the invention, the current magnitude is a function of the state of the resistance changing element and is thus employed to ascertain the state.

Turning now to FIG. 14A a method 350 for reading data from the memory architecture 200 of FIG. 10 is disclosed. Initially, sense circuits 114 are coupled to respective bit lines 108 at 352. For example, as illustrated in FIG. 10, such coupling can be achieved by activating the transistors 208 via the column decoder 206. While in one embodiment, multiple bits of data are read by coupling multiple sense circuits 114 to their respective bit lines, in alternative embodiments, data may be sensed one bit at a time. At 354 the sense bit lines are pre-charged. In one embodiment a pre-charge of the sense bit lines is performed by the respective sense circuit 114 coupling the bit line to a predetermined potential such as circuit ground.

Next, at 356 and 358 one of the two columns (e.g., 222) is isolated from the sense bit line 108 while the other column (e.g., 220) that shares the bit line is operably coupled thereto. In one embodiment this is performed by the control circuit 112 of FIG. 10, wherein one control line 224a is brought to a high potential, while the other control line 224b is held at a low potential. In the above manner, each of the transistors 102 of the unit cells along the unselected column (e.g., 222) are turned off, while the transistors of the selected column (e.g., 220) are tuned on. In addition, the column decoder 206 activates the transistors 210a, 210b so that the voltages on the control lines 224a, 224b are passed to the control lines 111a, 111b, respectively.

Unit cells 100 along the selected column are then read according to a predetermined sequence generally at 360. In one embodiment, the word line 106 of the first selected cell according to the predetermined sequence receives a word line read voltage at 362, and a sensing routine is then performed at 364 to ascertain the state of that selected unit cell.

FIG. 14B is a flow chart illustrating a method of sensing a data state of a unit cell 100 of FIG. 10 according to one exemplary embodiment. At 366 the current of the selected unit cell is sensed. An initial count "N" is then initialized at 367. IN one embodiment of the invention, for "N+1" available data states per unit cell, the count is initialized to "N". An initial reference current is generated at 368, for example, as illustrated in FIGS. 11 and 12 with V(ref3). The sensed current (Isense) and the reference current (Iref) are then compared at 370 and the expected result is evaluated to ensure proper operation. The reference current is then altered at 374 and the resultant reference current (e.g., I(ref2)) is compared with Isense, and the comparison result is evaluated at 376. If at 378 a change is detected at an output of the comparison circuit (YES), than a data state determination is made. If N=2, and the result at 378 is YES, then the data state is "level 3", for example, as illustrated in FIG. 12.

If no change occurs at the output (NO at 378), the count N is decremented at 382. If N is non-negative (NO at 384), the method 364 returns to 374 and the reference current is again altered at 374, and the new reference current is compared to the sensed current Isense at 376, and the data state determination continues. If, however, at 384 N is negative *YES at 384), then a determination is made that the unit cell being sensed is in the erased condition.

Returning to FIG. 14A, once the selected unit cell has been read, a determination is made at 390 whether such unit cell is the final unit cell in the selected column. If not (NO at 390), the method 350 proceeds to 392, wherein the word line voltage of the sensed unit cell is reduced or dropped down to its initial voltage, and the method proceeds to the next unit cell along the column according to the predetermined sequence at 394. The sequence of biasing the appropriate word line at 362 and the data sense routine at 364 is then repeated for the next unit cell in the column.

When at 390 it is determined that all the unit cells in the selected column have been read (YES at 390), the method proceeds to 396, wherein a determination is made whether both columns sharing the bit line 108 have been read. If not (NO at 396), the method proceeds to the next column at 398, wherein the control circuit 112 reduces a voltage on the control line 224a of the previously read column, and raises the voltage on the control line 224b of the next column to be read, thereby coupling the unit cells associated therewith to the sense bit line 108 at 400. The method then proceeds at 362 and 364 to select a unit cell of the new column and read the data thereat. Further, acts 390, 392, 394 proceed for this next column until all unit cells have been read according to the predetermined sequence.

If a determination is made at 396 that both columns have been read (YES at 396), then the read method 350 ends at 402.

Figure 15:
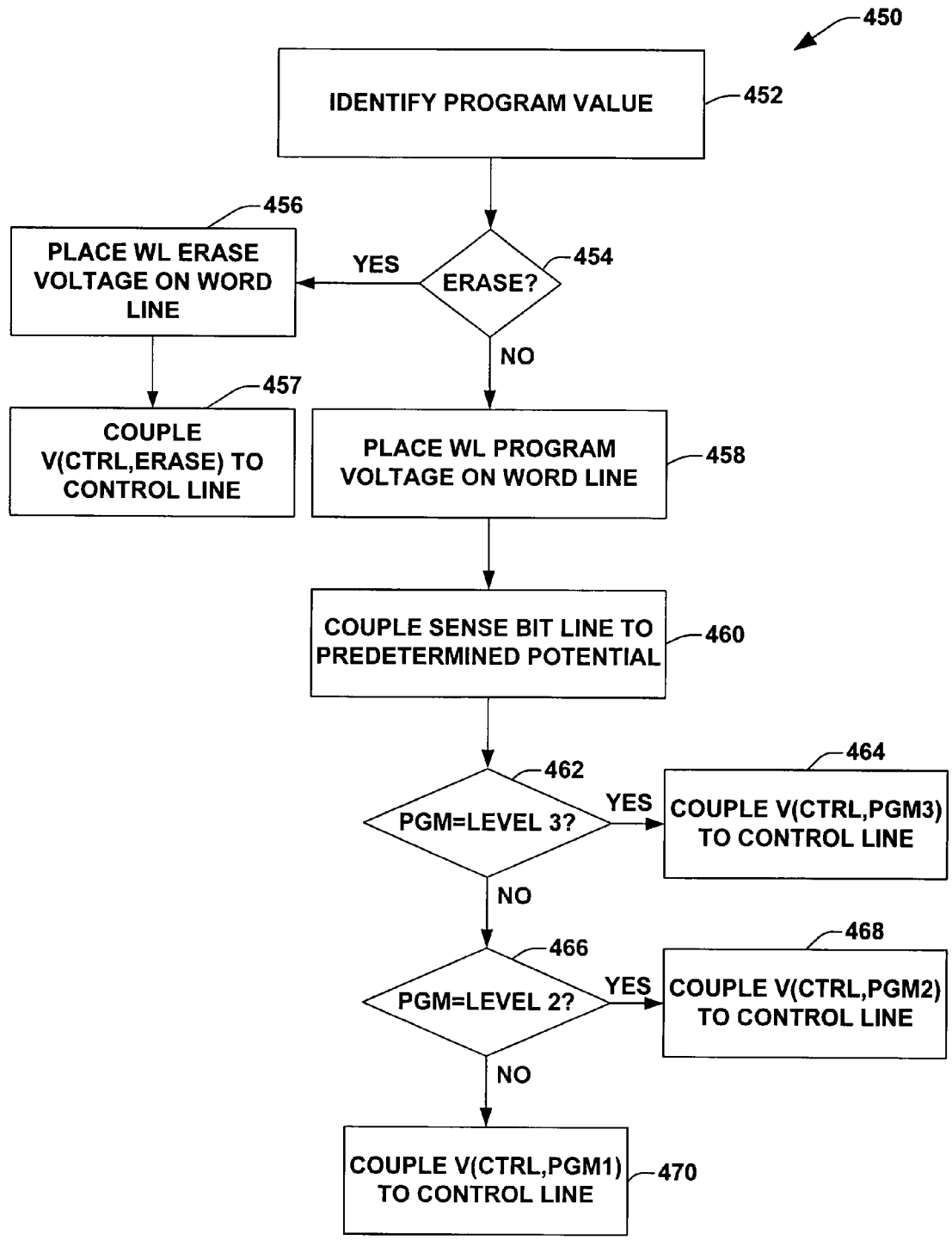
FIG. 15 is a flow chart diagram illustrating a method of programming a resistance changing memory unit cell according to another aspect of the invention.

Turning now to FIG. 15, a method of programming the unit cell 100 of FIG. 6 is provided, and is designated at reference numeral 450. Initially, the desired program value is identified at 452, and a query is made at 454 whether or not the program operation is an erase operation. If so (YES at 456), a word line erase voltage is placed on the word line 106 (e.g., V(WL, erase) illustrated in FIG. 7) at 456, and an appropriate control voltage (e.g., V(CTRL,erase)) is placed on the control line 111. If, however, the answer to the query at 454 is in the negative (NO at 454), then a program voltage (e.g., V(WL, pgm)) is placed on the word line 106 at 458, and the sense bit line 108 is coupled to a predetermined potential such as circuit ground, in one example, at 460.

Further, at 462 a query is made whether the level to be programmed to the resistance changing element 104 of the unit cell 100 is a "level 3". If so (YES at 462), then the control line 111 is coupled to an appropriate control voltage (e.g., V(CTRL, pgm3) of FIG. 7) at 464. If not (NO at 462), another query is made at 466 whether the level to be programmed is a "level 2". If so (YES at 466), then the control line 111 is coupled to an appropriate control voltage (e.g., V(CTRL, pgm2) of FIG. 7) at 468. If not (NO at 466), then by default the desired level to program is a "level 1", and the control line 111 receives the appropriate control voltage (e.g., V(CTRL, pgm1) of FIG. 7) at 470.

Figure 16:
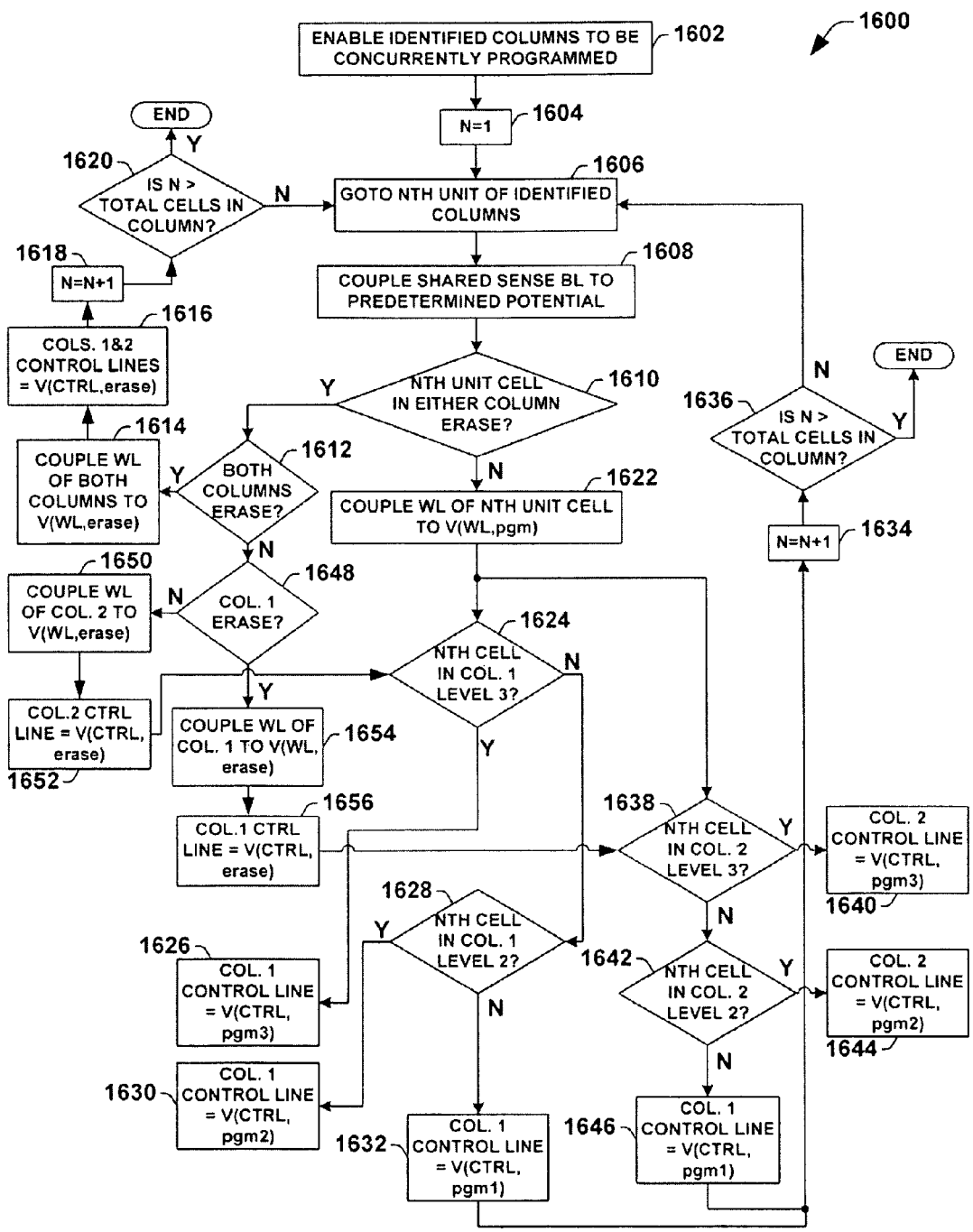
FIG. 16 is a flow chart diagram illustrating a method of programming data in the resistance changing memory array architecture of FIG. 10 according to still another aspect of the invention.

Referring to the flowchart in FIG. 16, a method 1600 starts at 1602 to enable identified columns to be concurrently programmed. At 1604, N is initialized to 1. At 1606, the method goes to the Nth unit of identified columns. At 1608, shared sense BL is coupled to a predetermined potential. At 1610, a determination is made whether the Nth unit cell in either column is to be erased. If so (Y at 1610), another determination is made at 1612 whether both columns are to be erased. If so (Y at 1612), WLs of both columns are coupled to predetermined erase voltage V(WL, erase) in 1614. At 1616, columns 1 & 2 control lines are coupled to a pre-determined erase voltage V(CTRL, erase). At 1618, N is incremented, after which a determination is made in 1620 whether N is greater than the total cells in a column. If so (YES at 1620). the method ends, otherwise (NO at 1620) the next unit of identified columns is processed.

If the Nth unit cell in the columns is not to be erased (N at 1610), the WL of the Nth unit cell is coupled to a predetermined programming voltage (V(WL, pgm)) at 1622. For the Nth cell in column 1, a determination is made as to whether it is to be programmed to level 3 at 1624. If so (Y at 1624), a predetermined program voltage V(CTRL, pgrm3) is coupled to the control line of column 1 at 1626. Otherwise (N at 1624), a determination is made at 1628 whether the Nth cell at column 1 is to be programmed to level 2. If so (Y at 1628), a predetermined voltage V(Ctrl, pgrm2) is applied to column 1's control line at 1630. If not (N at 1628), a predetermined voltage V(CTRL, pgrm1) is applied to column 1's control line at 1632. At 1634, N is incremented, after which a determination is made in 1636 whether N is greater than the total cells in a column. If so (YES at 1636), the method ends, otherwise (NO at 1636) the next unit of identified columns is processed.

For the Nth cell in column 2, a determination is made as to whether it is to be programmed to level 3 at 1638. If so (Y at 1638), a predetermined program voltage V(CTRL, pgrm3) is coupled to the control line of column 2 at 1640. Otherwise (N at 1638), a determination is made at 1642 whether the Nth cell at column 2 is to be programmed to level 2. If so (Y at 1642), a predetermined voltage V(Ctrl, pgrm2) is applied to column 2's control line at 1644. If not (N at 1642), a predetermined voltage V(CTRL, pgrm1) is applied to column 2's control line at 1646.

If only one of the columns of the identified columns is to be erased (N at 1612), a determination is made as to whether column 1 is to be erased at 1648. If not (N at 1648), the method proceeds to 1650 where a predetermined voltage V(WL, erase) is coupled to the WL of column 2. At 1652, a predetermined voltage V(CTRL, erase) is applied to column 2's wordline. After 1652, the method 1600 proceeds to 1624 as previous discussed. If column 1 is to be erased (Y at 1648), a predetermined voltage V(WL, erase) is coupled to the WL of column 1 at 1654. At 1656, a predetermined voltage V(CTRL, erase) is applied to column 1's control 1. The method then moves to 1638 as previously discussed.

Figure 17:
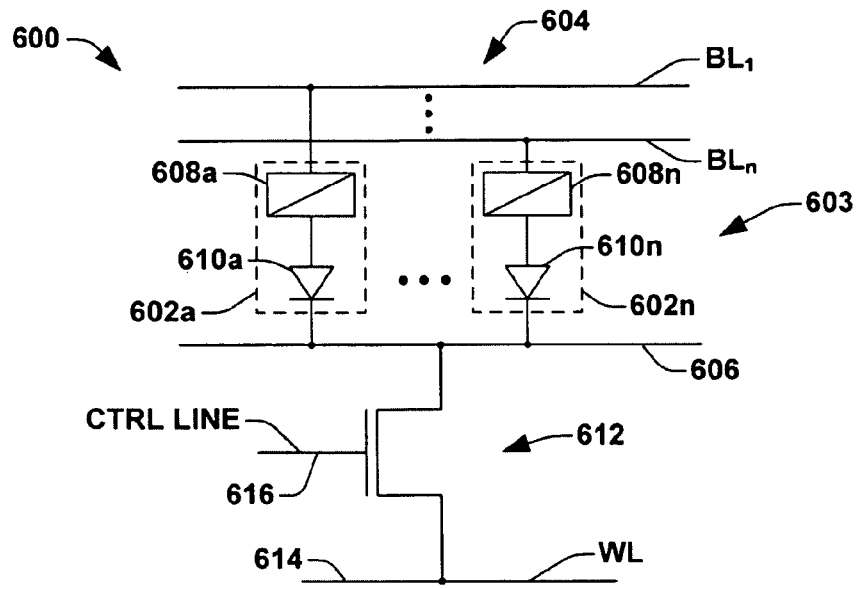
FIG. 17 is a combined block/schematic diagram illustrating a diode-based resistance changing memory unit cell according to one embodiment of the invention.

According to another embodiment of the invention, a diode based resistance changing memory architecture is disclosed, wherein a unit cell group shares a current control component that is local thereto, as illustrated in FIG. 17 at reference numeral 600. As illustrated in FIG. 17, a plurality of unit cells 602a-602n are coupled as a group 603 between respective bit lines 604 (BL$_1$-BL$_n$), and a local current bus 606. Further, each unit cell 602 comprises a restive-switching memory element 608 and a diode 610. While a diode 610 is employed in one example, any uni-directional conduction component may be employed and such alternatives are contemplated as falling within the scope of the invention.

Still referring to FIG. 17, a current control component 612 is coupled between the local current bus 606 and a word line 614, and a control terminal of the current control component is coupled to a control line 616. As shown in FIG. 17, a group of "n" unit cells 602 share a single current control component 612, thereby advantageously making each unit cell more compact with respect to area. The current control component 612 is relatively close to each of the unit cells 602 in the group 603, thereby reducing or altogether eliminating an impact of bit line capacitance on cell programming operations. As will be further appreciated in the discussion below, the diodes operate to prevent current flow from conducting between bit lines 604 of the group 603 during a read operation of one of the unit cells 602 of the group.

Figure 18:
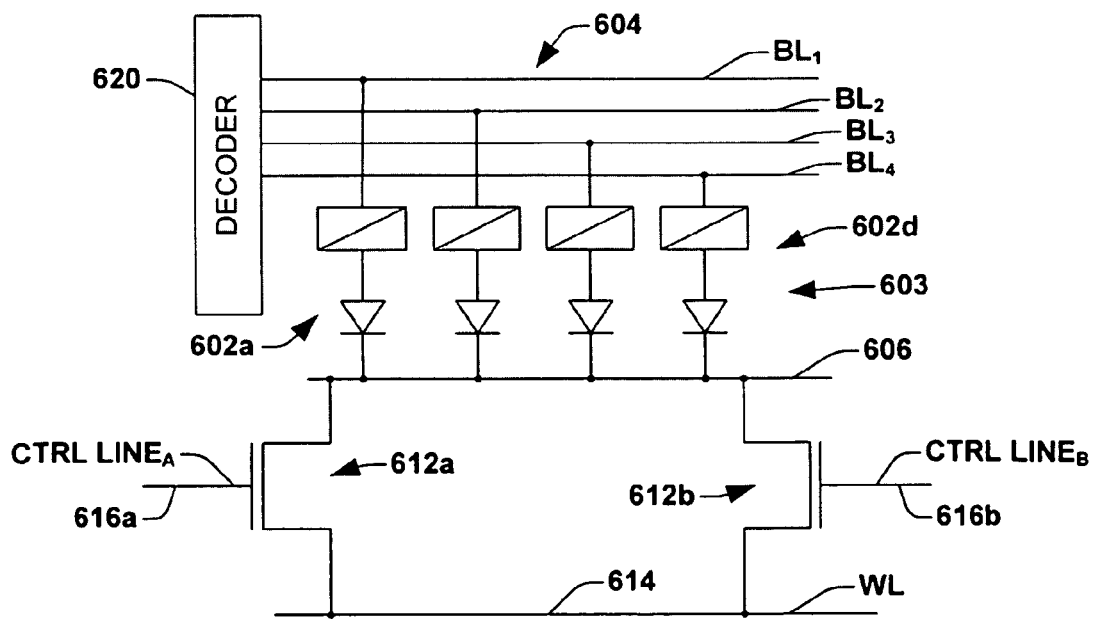
FIG. 18 is another combined block/schematic diagram illustrating a diode-based resistance changing memory unit cell organized in a unit cell group according to another embodiment of the invention.

FIG. 18 is another schematic diagram illustrating a memory cell group 603 comprising four unit cells 602a-602d coupled between a respective bit line 604 (BL$_1$-BL$_4$) and the local current bus 606. In the example of FIG. 18, two current control components 612a, 612b are provided in parallel, wherein in one example such components are spaced along the local current bus 606 to reduce an amount of difference in resistance seen by any one unit cell 602 and the common word line 614. Further, a row decoder 620 operates to bias the bit lines 604 appropriately for read and write (programming) operations, respectively.

Figure 19:
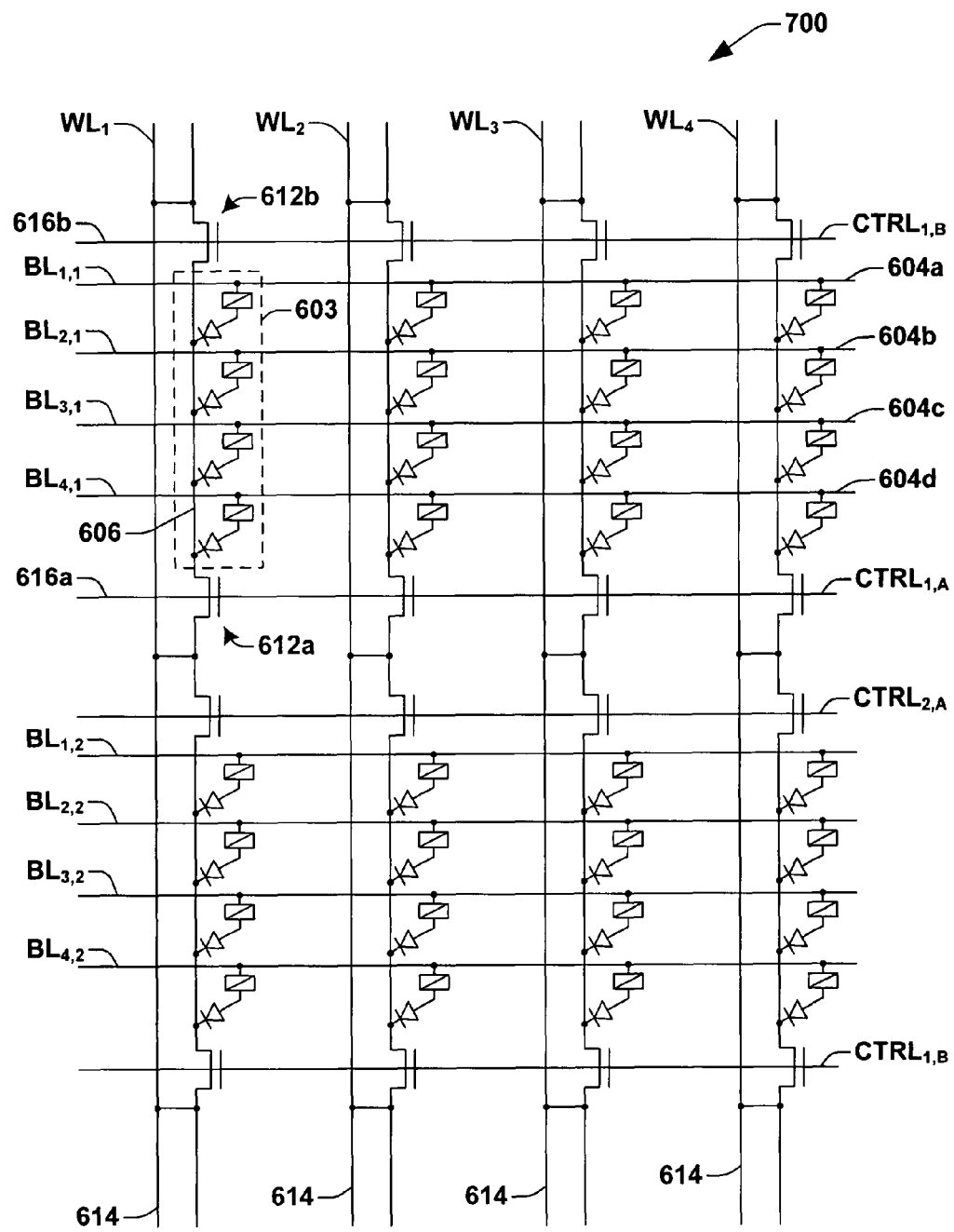
FIG. 19 is a schematic diagram illustrating a diode-based resistance changing array architecture showing multiple unit cell groups according to another embodiment of the invention.

FIG. 19 is a schematic diagram illustrating a portion 700 of a resistance changing memory array architecture, wherein the unit cells thereof are diode based unit cells. In the example shown in FIG. 19, a plurality of word lines 614 are organized as columns, while bit lines 604 run perpendicularly to the word lines as rows. As shown, bit lines are organized in unit cell groups 603, wherein, in this example, four unit cells are provided within each group. Alternatively, however, a few or greater number of unit cells per group may be utilized and such alternatives are contemplated as falling within the scope of the present invention.

In one embodiment, as illustrated in FIG. 19, each unit cell within a group 603 is coupled between a respective bit line 604 and a local current bus 606. The local current bus 606 associated with each group 603 is bounded on either side by a current control component 612a, 612b and is selectively coupled to a word line 614 therethrough. More particularly, four bit lines 604a-604d in a first group 603 (group 1) may be designated as $BL_{1,1}$; $BL_{2,1}$; $BL_{3,1}$ and $BL_{4,1}$, wherein BLX,Y represents the $X^{th}$ bit line in the $Y^{th}$ unit cell group. While the example shown in FIG. 19 provides for two current control components 612a, 612b per unit cell group 603, a single current control component may also be employed as shown in FIG. 17, and such alternative is contemplated as falling within the scope of the present invention.

Figure 20:
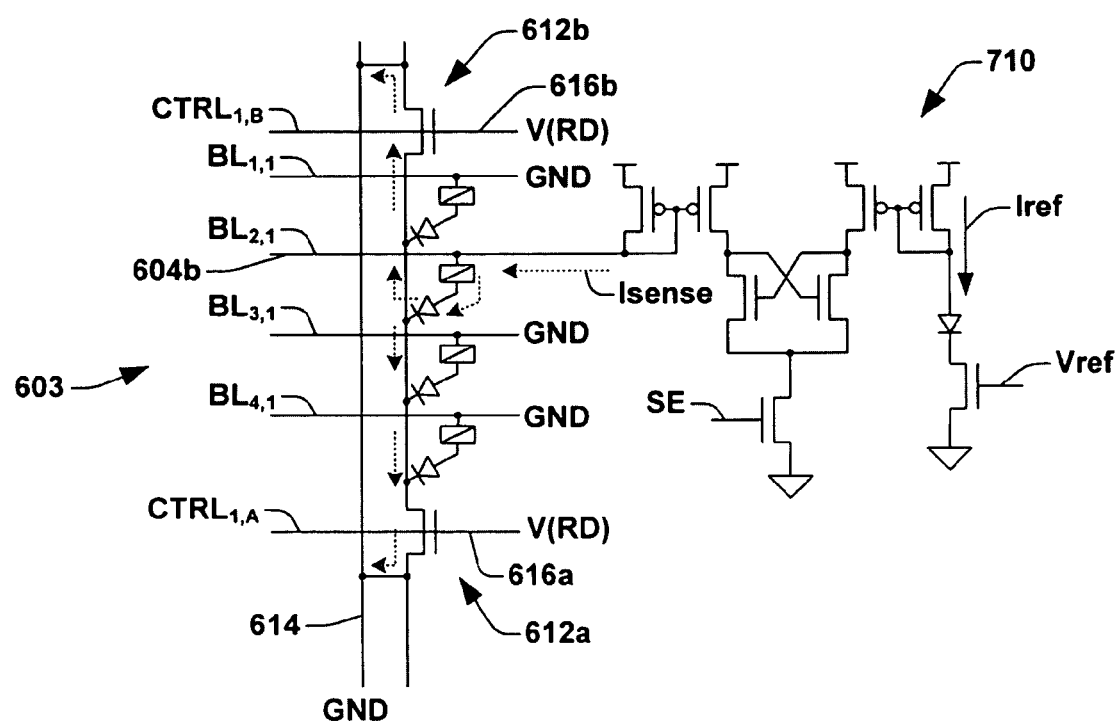
FIG. 20 is a schematic diagram illustrating a diode-based resistance changing unit cell within a unit cell group being read according to an aspect of the invention.

FIG. 20 is a schematic diagram illustrating a sense circuit 710 coupled to a selected bit line 604b in a unit cell group 603. According to one embodiment of the invention, the sense circuit 710 is selectively coupled to one of the bit lines 604 in the group so that only one of the unit cells 602 in each group is read at a time. Alternatively, since the diode 610 in each unit cell prevents current from other unit cells in the group from interfering with the sense current (Isense) in a given bit line, multiple unit cells in a given group may be read concurrently with a dedicated sense circuit, for example.

As shown in FIG. 20, one or more of the current control components 612a, 612b have control terminals 616a, 616b coupled to a read potential. In one embodiment the read potential (V(RD)) is sufficiently high to permit all the current conducting through the unit cell (Isense) to pass. For example, V(RD) may be a voltage that completely turns on a transistor when the current control component comprises a transistor device. Further, the word line 614 is coupled to a predetermined potential such as circuit ground.

Upon an appropriate biasing, a current is sensed (Isense) on the selected bit line that is indicative of the state of the resistance changing element 608. In one embodiment of the invention, the sense circuit 710 ascertains the data state of the selected unit cell by comparing the sensed current with a plurality of reference currents (Iref), for example, as described above in conjunction with FIG. 12. Upon determining when the outputs of the latch within the sense circuit switch, the data state of the unit cell may be ascertained. For example, Vref is varied to generate a plurality of different reference currents (Iref) that are compared to the sense current (Isense) by mirror circuits, for example. The sense circuit 710 may be selectively enabled by bringing a sense enable (SE) signal high.

Figure 21:
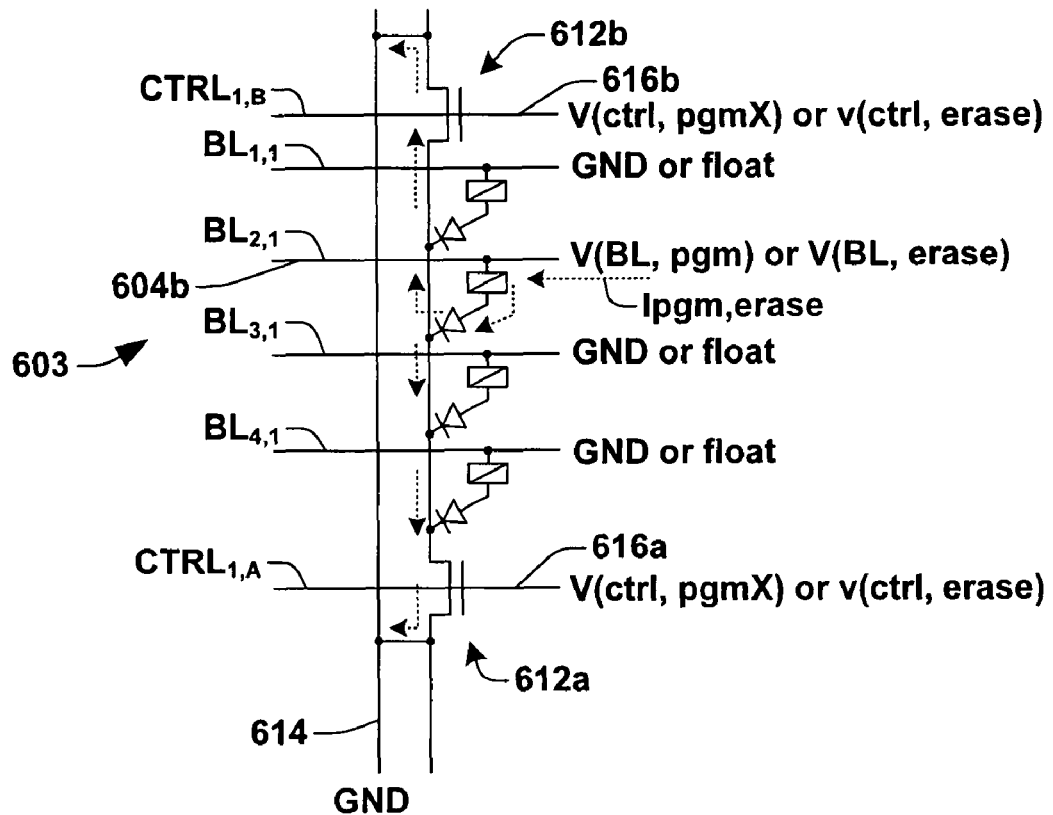
FIG. 21 is a schematic diagram illustrating a diode-based resistance changing unit cell within a unit cell group being erased or programmed according to an aspect of the invention.
Figure 22:
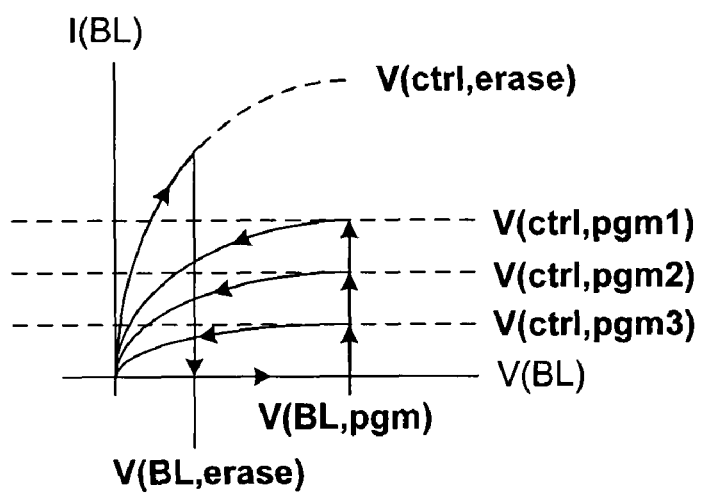
FIG. 22 is a voltage/current diagram illustrating one or more operating states of the diode-based resistance changing memory unit cell of FIGS. 20 and 21 according to an embodiment of the invention.

FIG. 21 is a schematic diagram illustrating a programming of a unit cell in accordance with one aspect of the invention. In the illustration of FIG. 21, the unit cell associated with the second bit line in the first group ($BL_{2,1}$) is to be programmed. Initially, the word line 614 is coupled to a predetermined potential such as circuit ground, while the other non-selected bit lines 604 are permitted to float or are coupled to a predetermined potential such as circuit ground. The bit line 604b of the selected unit cell is then coupled to one of two different potentials depending upon whether the write step is a program or an erase of the resistance changing element 608. As shown in FIG. 22, the bit line voltage of an erase condition (V(BL, erase)) is less than that for a program voltage (V(BL, pgm)) regardless of the intended programming level.

Generally concurrently with the bit line, the control line 616 of the current control component 612 is coupled to a write voltage that is a function of whether the cell is being erased or programmed. Further, as illustrated in FIG. 22, the control line voltage is further uniquely associated with the program level desired, wherein the voltage (V(ctrl, pgmX)) operates to limit the amount of programming current (Ipgm) conducting through the unit cell. For different program control line voltages, different current limits are set, thereby facilitating a programming of the cell to different data states, as may be desired.

In one embodiment of the invention, two current control components 612a, 612b may operate in parallel to limit the current conduction through the selected unit cell. In this example, the control voltage on the control line is selected to account for the fact that two parallel current paths exist, however, the current conducting through the untíl cell (Ipgm) must comport with the relative current limit values set forth in FIG. 22. In another embodiment of the invention, only a single current control component 612 is provided for each unit cell group 603. Further, in still another embodiment, one of the current control components may operates to electrically isolate the unit cell group 603 from a neighboring group during programming operations, while the other component in the group operates to limit the current as desired.

As can be appreciated in FIG. 21, the diode 610 in each non-selected unit cell in the group 603 serves to block the program or erase current conducting in the selected unit cell from disturbing the data within the non-selected cells. Further, as can be appreciated from FIGS. 19 and 21, each unit cell group 603 can be addressed in a write operation concurrently, so that programming operations can be expedited. In the illustrated example, with four unit cells organized within each group, the entire array portion 700 may be programmed in four consecutive operations. More generally, for an architecture with "n" unit cells per group, programming can be completed in "n" consecutive programming operations.

Methods of addressing the diode-based architecture will now be disclosed. Although the methods below are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated.

Figure 23:
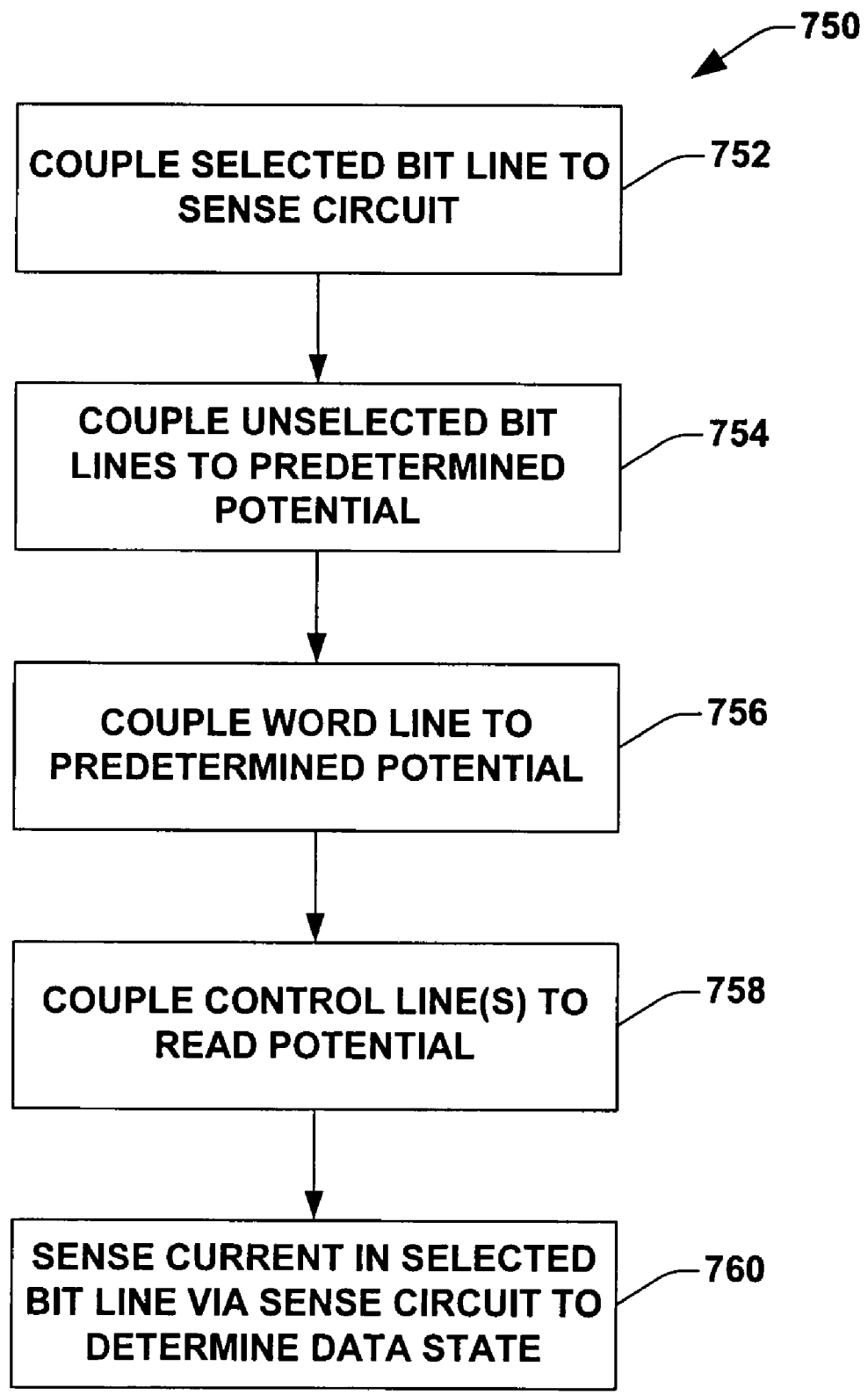
FIG. 23 is a flow chart diagram illustrating a method of reading data in the diode-based resistance changing memory array architecture of FIG. 19 according to still another aspect of the invention.

Turning now to FIG. 23, a method of reading a resistance changing unit cell in a diode-based unit cell architecture such as that illustrated in FIG. 17 is provided, and is designated generally at 750. A bit line associated with a selected unit cell in a unit cell group is coupled to a sense circuit at 752. In one embodiment of the invention, the sense circuit comprises a sense amplifier configured to ascertain the state of the selected unit cell based on a read current sensed therethrough. In one embodiment the unselected bit lines associated with the unit cell group are coupled to a predetermined potential such as circuit ground at 754. Alternatively, non-selected bit lines may be allowed to float.

Still referring to the method 750 of FIG. 23, the word line associated with the unit cell group containing the selected unit cell is coupled to a predetermined potential such as circuit ground at 756. A control line such as line 616 in FIG. 17 is then coupled to a read potential at 758, wherein the read potential activates the current control component 612 associated with the group 603 containing the selected unit cell, yet concurrently does not artificially limit the read current through the cell. In other words, the read potential enables a current path for the selected unit cell to facilitate sensing thereof The read current conducting through the selected unit cell 602 is then sensed at 760, wherein a magnitude of the current is indicative of the data state thereof. In one embodiment, the data state of the selected unit cell is determined by comparing the sensed current conducting through the selected cell with a plurality of different reference currents. The data state of the cell is then determined by evaluating the results of the various comparisons.

In one embodiment of the invention each of the unit cells associated with a given unit cell group 603 are read in a consecutive fashion, wherein each cell is read alone. In such an example, the sense circuit may be consecutively switched to the unit cell in the group, thereby allowing for a shared sense circuit. In another alternative embodiment of the invention, each of the unit cells within a group have a dedicated sense circuit associated therewith, wherein each of the unit cells within a group is read in a concurrent fashion.

Figure 24:
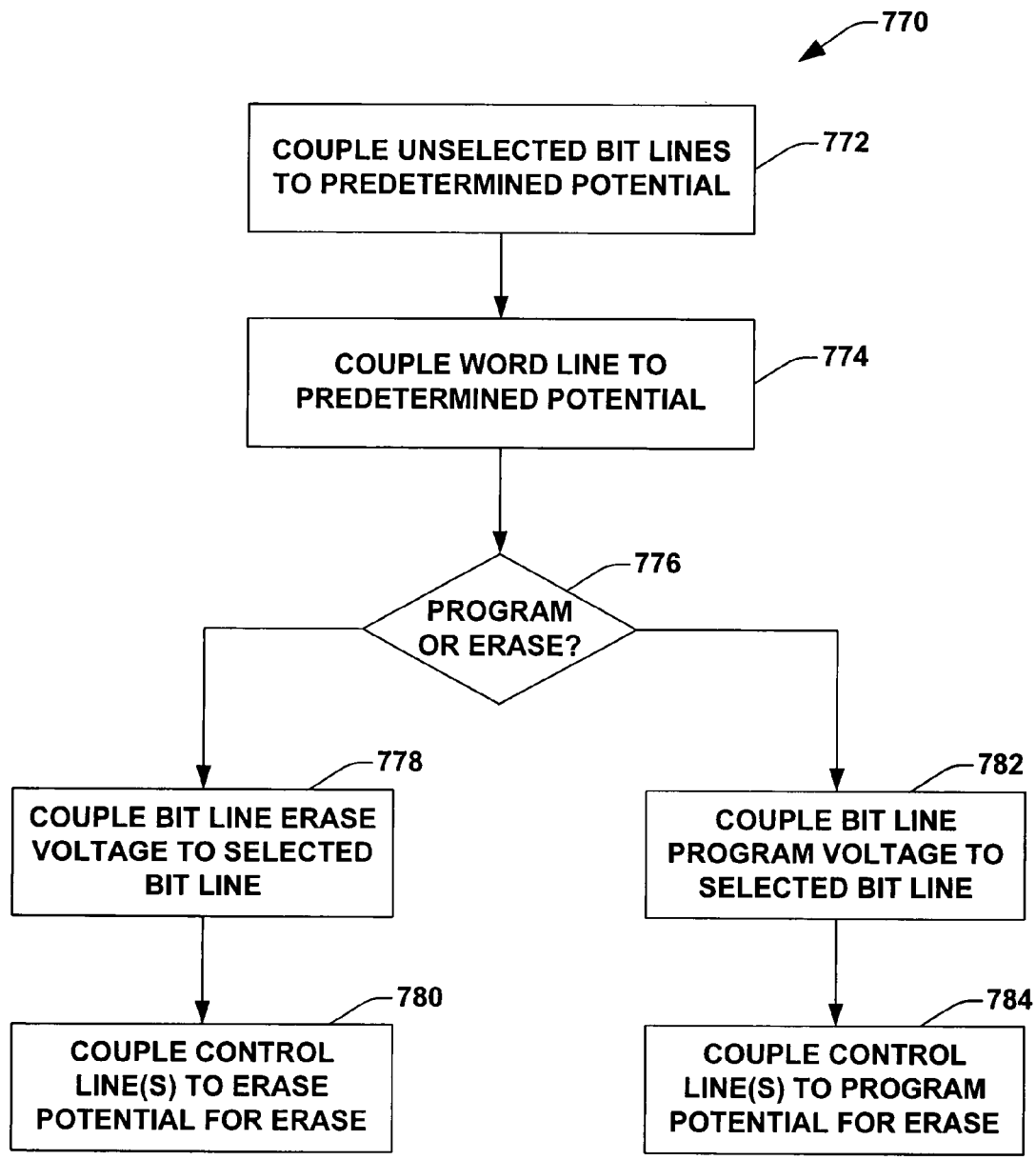
FIG. 24 is a flow chart diagram illustrating a method of writing to a diode-based resistance changing memory unit cell according to another aspect of the invention.

Turning now to FIG. 24, a method 770 of performing a write operation to a resistance changing unit cell in a diode-based architecture such as that illustrated in FIG. 17 is provided. Initially, unselected bit lines in a unit cell group 603 are either coupled to a predetermined potential such as circuit ground or allowed to float at 772. The word line 614 associated with the unit cell group containing the selected unit cell 602 is then coupled to a predetermined potential such as circuit ground at 774. A determination is made at 776 whether the write operation to be performed is an erase or a program operation. If a determination is made that the selected unit cell 602 is to be erased, a bit line erase voltage is coupled to the bit line 604 of the selected unit cell 602 at 778, and a control line (or lines) associated with the selected cell employed to control current in the cell group is coupled to a control erase potential at 780. As illustrated, for example, in FIG. 22, a control erase potential (V(ctrl, erase)) does not provide any substantial limit on current conduction through the selected cell, while the bit line erase potential (V(BL, erase)) is a modest value.

If a programming of the selected cell is desired, the method 770 proceeds to 782, wherein the bit line is coupled to a program voltage (V(BL, pgm)) and a control line 616 is coupled to a program potential (V(ctrl, pgmX) that is a function of the desired program data level. For example, as illustrated in FIG. 22, based on the desired data state, a unique control line voltage operates to control a current control component 612 to limit the current conducting through the selected cell to the appropriate current level.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The following is claimed:

1. A resistance changing memory architecture, comprising:
   a plurality of resistance changing memory unit cells coupled between a plurality of sense bit lines and a local current bus, wherein each unit cell comprises:
   a resistance changing memory element coupled to the sense bit line; and
   a diode coupled to between the resistance changing memory element and the local current bus;
   a current control component having a controlled current path that extends between the local current bus and a word line, and a control terminal of the current control component that is operable to control a current conducting through the resistance changing memory element and through the controlled current path from the local current bus to the word line;
   wherein the control terminal is configured to receive a plurality of different control signals, and provide a current limiting function comprising a plurality of differing current levels greater than two in response thereto.

2. The memory architecture of claim 1, wherein the resistance changing memory element comprises a metal-insulator-metal memory element.

3. The memory architecture of claim 2, wherein the metal-insulator-metal memory element comprises a binary oxide.

4. The memory architecture of claim 1, wherein the current control component comprises a transistor.

5. The memory architecture of claim 1, wherein the plurality of unit cells form a unit cell group, and wherein the current control component provides a selective current limiting function for each of the unit cells in the group.

6. The memory architecture of claim 1, wherein the plurality of unit cells form a unit cell group, and wherein during a read of a selected unit cell within the group the diodes of unselected unit cells within the group operate to block current to the respective resistance changing memory elements of the unselected unit cells.

7. A resistance changing memory array architecture, comprising:
   an array of resistance changing memory unit cells, wherein the unit cells are organized in unit cell groups, and wherein each unit cell in a respective group is coupled between a respective sense bit line and a shared local current bus; and
   a current control component having a controlled current path that extends between the shared local current bus of a unit cell group and a word line and a control terminal that is operable to control a current conducting through the resistance changing memory element and through the controlled current path from the local current bus to the word line, and configured to selectively limit a current conducting therethrough from one or more of the unit cells in the unit cell group;
   wherein the control terminal is configured to receive a plurality of different control signals, and provide a current limiting function comprising a plurality of differing current levels greater than two in response thereto.

8. The array architecture of claim 7, wherein each unit cell comprises a resistance changing memory element and a diode coupled in series, wherein the diode is oriented to prevent current from passing from the local current bus to the respective sense bit line.

9. The array architecture of claim 7, further comprising a control circuit configured to provide a read control signal to the current control component during a read operation, wherein the read control signal permits current conduction through the current control component with substantially no limit thereto.

10. The array architecture of claim 9, further comprising a sense circuit operably coupled to the selected unit cell in the unit cell group during the read operation, and configured to determine a state of the selected unit cell based on a read current sensed therethrough.

11. The array architecture of claim 10, wherein the sense circuit is configured to determine the state of the selected unit cell by comparing the read current to a plurality of reference currents.

12. The array architecture of claim 7, further comprising a control circuit configured to couple a unique voltage to the bit line of a selected unit cell in the group during a write operation based on whether the write operation is an erase or a program operation, wherein the unique voltage on the bit line for the erase operation is less than the unique voltage on the bit line for the program operation.

13. The array architecture of claim 12, wherein the control circuit is further configured to provide a unique control line voltage to a control terminal of the current control component associated with the unit cell group of a selected unit cell during a write operation based on whether the write operation is an erase or a program operation.

14. The array architecture of claim 13, wherein the control line voltage during the erase operation causes the current control component to not limit the current conducting through the selected unit cell.

15. The array architecture of claim 13, wherein the control line voltage during the program operation comprises one of a plurality of different values, wherein each of the different value reflect a unique current limit value associated with a desired program state.

16. A resistance changing memory array architecture, comprising:
   an array of resistance changing memory unit cells, wherein the unit cells are organized in unit cell groups, and wherein each unit cell in a respective group is coupled between a respective sense bit line and a shared local current bus;
   a current control component having a controlled current path that extends between the shared local current bus of a unit cell group and a word line and a control terminal that is operable to control a current conducting through the controlled current path from the local current bus to the word line, and configured to selectively limit a current conducting therethrough from one or more of the unit cells in the unit cell group; and a sense circuit comprising a transistor having a control terminal and a current path operably coupled to a selected unit cell in the unit cell group during a read operation; the sense circuit configured to determine a state of the selected unit cell by comparing a read current sensed through the selected unit cell to a plurality of reference currents provided on the current path, where the reference currents are generated by applying a plurality of different voltage levels to the control terminal of the transistor.

17. A resistance changing memory array architecture, comprising:

an array of resistance changing memory unit cells, wherein the unit cells are organized in unit cell groups, and wherein each unit cell in a respective group is coupled between a respective sense bit line and a shared local current bus;

a current control component having a controlled current path that extends between the shared local current bus of a unit cell group and a word line and a control terminal that is operable to control a current conducting through a resistance changing memory element and through the controlled current path from the local current bus to the word line, and configured to selectively limit a current conducting therethrough from one or more of the unit cells in the unit cell group; and a control circuit configured to couple a unique voltage to the bit line of a selected unit cell in the group during a write operation based on whether the write operation is an erase or a program operation, wherein the unique voltage on the bit line for the erase operation is less than the unique voltage on the bit line for the program operation.

18. A resistance changing memory architecture, comprising:

a plurality of resistance changing memory unit cells coupled between a plurality of sense bit lines and a local current bus, wherein each unit cell comprises:

a resistance changing memory element coupled to the sense bit line; and a diode coupled to between the resistance changing memory element and the local current bus; and a first current control component coupled between a first location on the local current bus and the wordline; and a second current control component coupled between a second location on the local current bus and the wordline, wherein the plurality of resistance changing memory unit cells are coupled between the first and second locations on the local current bus.

19. The resistance changing memory architecture of claim 18, wherein the first current control component comprises:

a controlled current path that extends between the local current bus and a word line, and a control terminal that is operable to control current conducting through the resistance changing memory elements on the local current bus and through the controlled current path from the local current bus to the word line.

* * * * *